United States Patent
Wada

(10) Patent No.: US 11,238,919 B2
(45) Date of Patent: Feb. 1, 2022

(54) SEMICONDUCTOR STORAGE DEVICE

(71) Applicant: KIOXIA CORPORATION, Tokyo (JP)

(72) Inventor: Masaharu Wada, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/006,238

(22) Filed: Aug. 28, 2020

(65) Prior Publication Data
US 2021/0201980 A1 Jul. 1, 2021

(30) Foreign Application Priority Data
Dec. 27, 2019 (JP) .............................. JP2019-238327

(51) Int. Cl.
| | | |
|---|---|---|
| *G11C 16/08* | (2006.01) | |
| *G11C 11/408* | (2006.01) | |
| *G11C 11/4094* | (2006.01) | |
| *G11C 5/06* | (2006.01) | |
| *G11C 5/02* | (2006.01) | |
| *G11C 11/4091* | (2006.01) | |

(52) U.S. Cl.
CPC .......... *G11C 11/4085* (2013.01); *G11C 5/025* (2013.01); *G11C 5/06* (2013.01); *G11C 11/4091* (2013.01); *G11C 11/4094* (2013.01)

(58) Field of Classification Search
CPC .................................................. G11C 11/401
USPC ........................................................ 365/149
See application file for complete search history.

(56) References Cited

U.S. PATENT DOCUMENTS

| | | | |
|---|---|---|---|
| 6,529,399 | B1 | 3/2003 | Namekawa et al. |
| 9,548,398 | B2 | 1/2017 | Chung et al. |
| 9,698,272 | B1 | 7/2017 | Ikeda et al. |
| 10,147,681 | B2 | 12/2018 | Yamazaki et al. |
| 2012/0056647 | A1* | 3/2012 | Nagatsuka ........ H01L 21/02631 327/109 |
| 2015/0115350 | A1 | 4/2015 | Maejima |
| 2015/0255139 | A1* | 9/2015 | Atsumi .................... G11C 7/16 257/43 |
| 2018/0269210 | A1* | 9/2018 | Tezuka ................ H01L 27/1225 |
| 2019/0035456 | A1 | 1/2019 | Ishii |
| 2019/0057734 | A1* | 2/2019 | Onuki ................... H01L 29/792 |
| 2019/0122725 | A1 | 4/2019 | Chen et al. |
| 2019/0147954 | A1 | 5/2019 | Yip |
| 2019/0295626 | A1* | 9/2019 | Ikeda .................. G11C 11/4094 |

FOREIGN PATENT DOCUMENTS

| | | |
|---|---|---|
| JP | 2003204042 A | 7/2003 |
| JP | 2017168623 A | 9/2017 |
| TW | 201605088 A | 2/2016 |

* cited by examiner

*Primary Examiner* — Min Huang
(74) *Attorney, Agent, or Firm* — Kim & Stewart LLP

(57) ABSTRACT

According to one embodiment, a semiconductor storage device includes a first stacked portion including a first peripheral circuit and a second stacked portion above the first stacked portion. The second stacked portion including a memory cell, a word line connected to the memory cell, a bit line connected to the memory cell and the first peripheral circuit, and at least one of a second peripheral circuit connected to the bit line and a third peripheral circuit connected to the word line. The at least one of the second or third peripheral circuits including a field effect transistor having a channel layer containing an oxide semiconductor.

12 Claims, 15 Drawing Sheets

|       | 00 | 10 | 01 | 11 |
|-------|----|----|----|----|
| MWLp  | L  | H  | L  | H  |
| MWLn  | H  | L  | H  | L  |
| WDRVp | L  | L  | H  | H  |
| WDRVn | H  | H  | L  | L  |
| WL    | L  | L  | L  | H  |

SEMICONDUCTOR STORAGE DEVICE

CROSS-REFERENCE TO RELATED APPLICATION(S)

This application is based upon and claims the benefit of priority from Japanese Patent Application No. 2019-238327, filed Dec. 27, 2019, the entire contents of which are incorporated herein by reference.

FIELD

Embodiments described herein relate generally to a semiconductor storage device.

BACKGROUND

A semiconductor storage device including a bit line, a word line, and a memory cell (including a transistor and a capacitor) is known. By selecting the bit line and the word line and applying a voltage, it is possible to write and read data to and from the memory cell.

DETAILED DESCRIPTION

Figure 1:
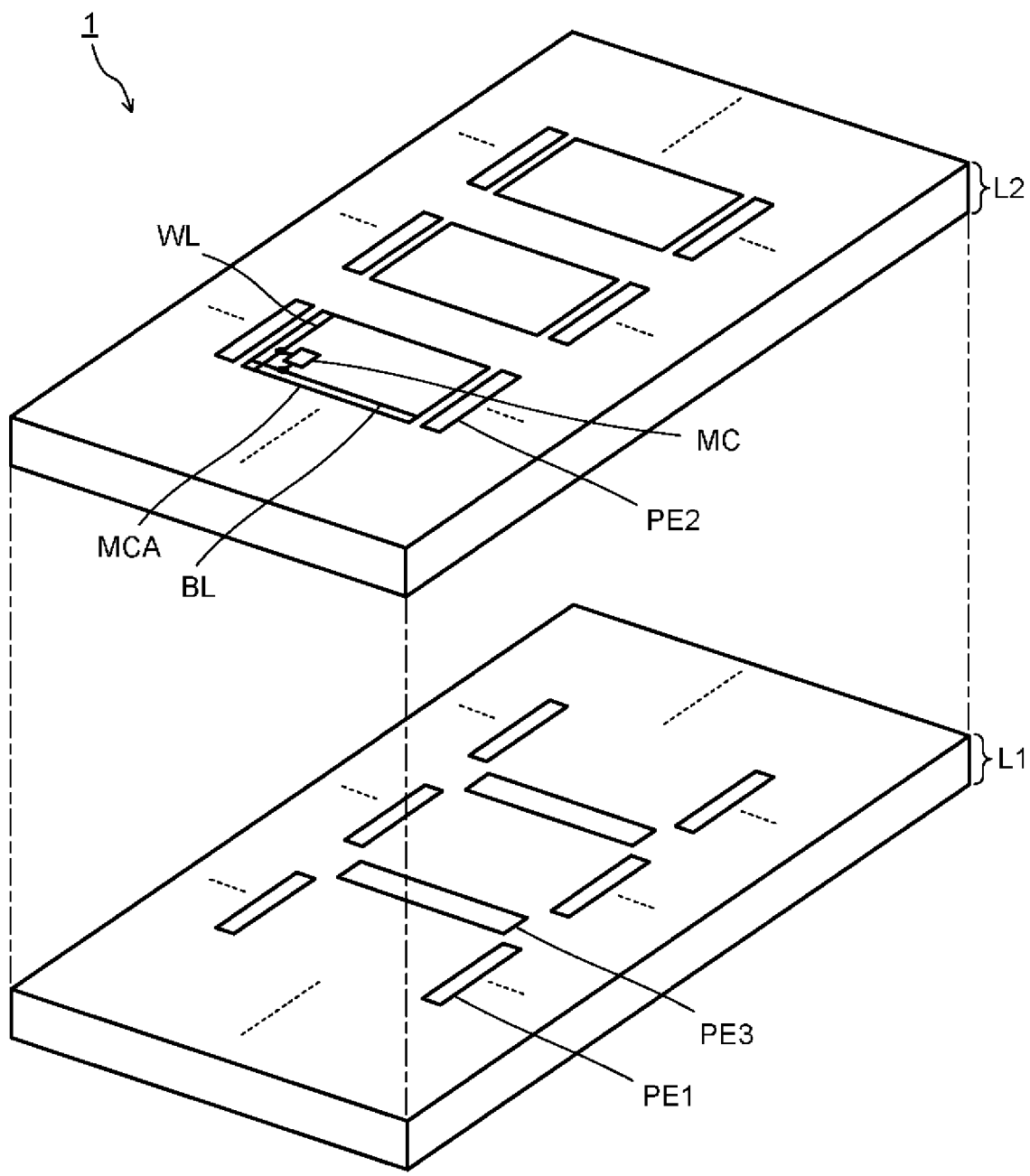
FIG. 1 is a schematic diagram of a semiconductor storage device according to a first embodiment.

Embodiments provide a semiconductor storage device that increases degrees of freedom in layout of a peripheral circuit.

In general, according to one embodiment, a semiconductor storage device includes a first stacked portion including a first peripheral circuit and a second stacked portion above the first stacked portion. The second stacked portion includes a memory cell, a word line connected to the memory cell, a bit line connected to the memory cell and the first peripheral circuit, and at least one of a second peripheral circuit connected to the bit line or a third peripheral circuit connected to the word line. The at least one peripheral circuit includes a field effect transistor including a channel layer containing an oxide semiconductor.

Hereinafter, certain example embodiments will be described with reference to the drawings. In the drawings, depicted relationships between dimensions such as the thickness of each component and the planar sizes, the ratio between dimensions of each component, and the like may differ from the actual product. In addition, in the described example embodiments, substantially the same components are denoted by the same reference numerals, and description thereof will be omitted as appropriate.

The term "connection" as used herein includes not only physical connection but also electrical connection.

First Embodiment

FIG. 1 is a schematic diagram illustrating a configuration example of a semiconductor storage device 1. A semiconductor storage device 1 illustrated in FIG. 1 is a dynamic random access memory (DRAM), and includes a stacked portion L1, including a peripheral circuit PE1 and a peripheral circuit PE3, and a stacked portion L2, including a memory cell array MCA and a peripheral circuit PE2. The stacked portion L2 is provided above the stacked portion L1. Memory cell arrays MCA, peripheral circuits PE1, peripheral circuits PE2, and peripheral circuits PE3 are arranged, for example, in an X-axis direction or a Y-axis direction perpendicular to the X-axis direction. The stacked portion L2 is stacked above the stacked portion L1 along a Z-axis direction perpendicular to the X-axis direction and the Y-axis direction. For the sake of convenience, FIG. 1 illustrates the stacked portion L1 and the stacked portion L2 separate from each other in an exploded view.

The memory cell array MCA includes a plurality of memory cells MC. Each memory cell MC is connected to one of a plurality of word lines WL and one of a plurality of bit lines BL. The semiconductor storage device 1 can write and read data to and from the memory cell MC by selecting the corresponding word line WL and bit line BL and applying a voltage thereto.

The peripheral circuit PE1 includes, for example, a sense amplifier. The peripheral circuit PE1 is provided below the memory cell array MCA or below the peripheral circuit PE2. Accordingly, an area of the semiconductor storage device 1 can be reduced. The stacked portion L1 may include a plurality of sense amplifiers for one memory cell array MCA. The stacked portion L1 may include another peripheral circuit different from the sense amplifier.

The peripheral circuit PE2 is connected to the bit lines BL. The peripheral circuit PE2 includes, for example, a column selection circuit connected to the bit lines BL. The peripheral circuit PE2 is provided, for example, above the peripheral circuit PE1, and may be provided above the memory cell MC. Accordingly, the area of the semiconductor storage device 1 can be reduced. The stacked portion L2 may include a plurality of column selection circuits. The stacked portion L2 may include a peripheral circuit different from a column selection circuit.

The peripheral circuit PE3 is connected to the word lines WL. The peripheral circuit PE3 includes, for example, a word line driving circuit, such as a segment word line driving circuit or a main word line driving circuit, connected to the word lines WL. As illustrated in FIG. 1, the peripheral circuit PE3 is provided in the stacked portion L1, but is not limited thereto, and may instead be provided in the stacked portion L2. A plurality of word line driving circuits may be provided for one memory cell array MCA. The stacked portion L1 may include a peripheral circuit different from the word line driving circuit.

Figure 2:
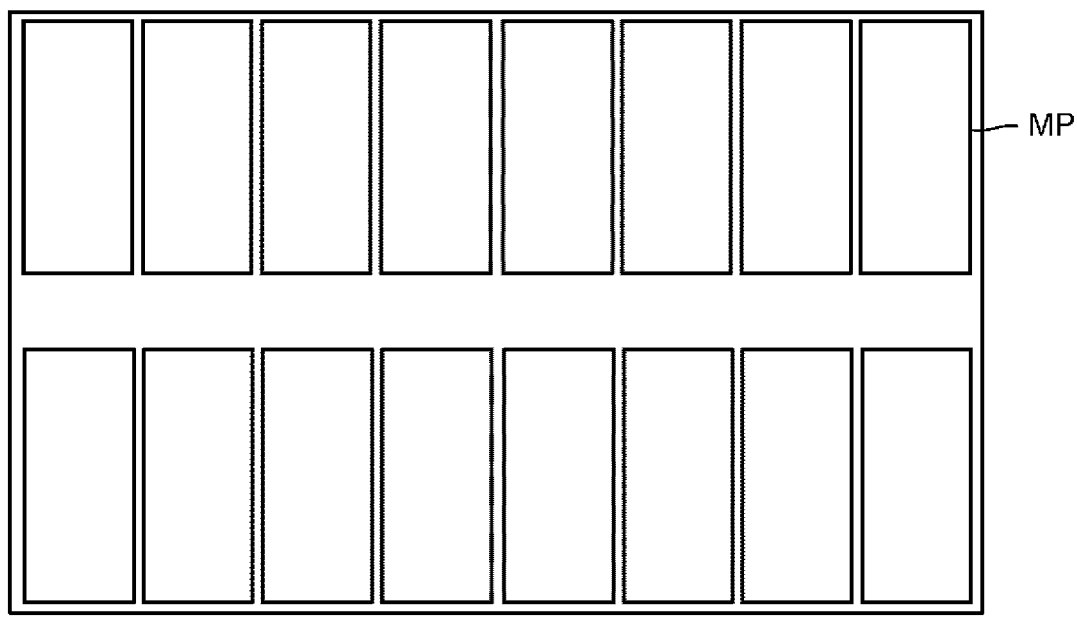
FIG. 2 depicts configurational aspects of a semiconductor storage device.
Figure 3:
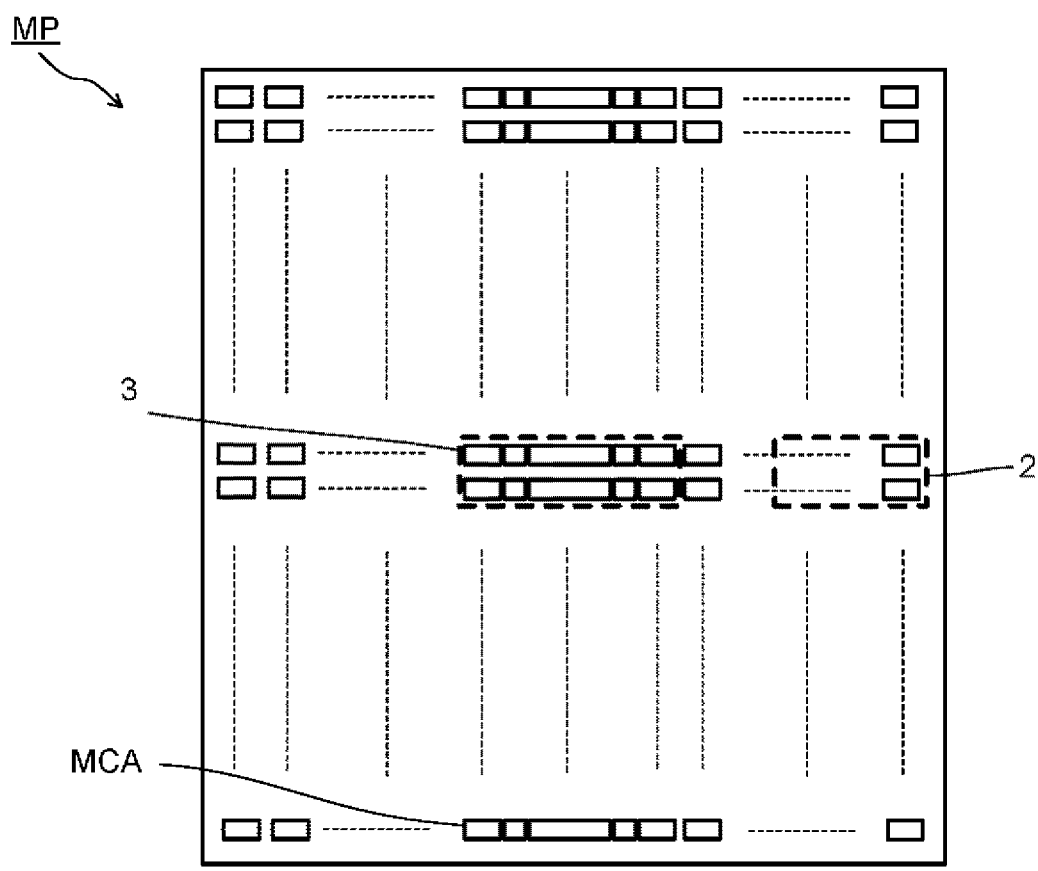
FIG. 3 depicts configurational aspects of a semiconductor storage device.

Here, a configuration example of the semiconductor storage device 1 will be described. FIGS. 2 to 5 are block diagrams illustrating a configuration example of the semiconductor storage device 1. As illustrated in FIG. 2, the semiconductor storage device 1 includes a plurality of storage units MP. As illustrated in FIG. 3, each storage unit MP includes a plurality of memory cell arrays MCA. The memory cells MC in the memory cell arrays MCA are connected to the peripheral circuit PE1 and the peripheral circuit PE2 through the bit lines BL and are connected to the peripheral circuit PE3 through the word lines WL.

Figure 4:
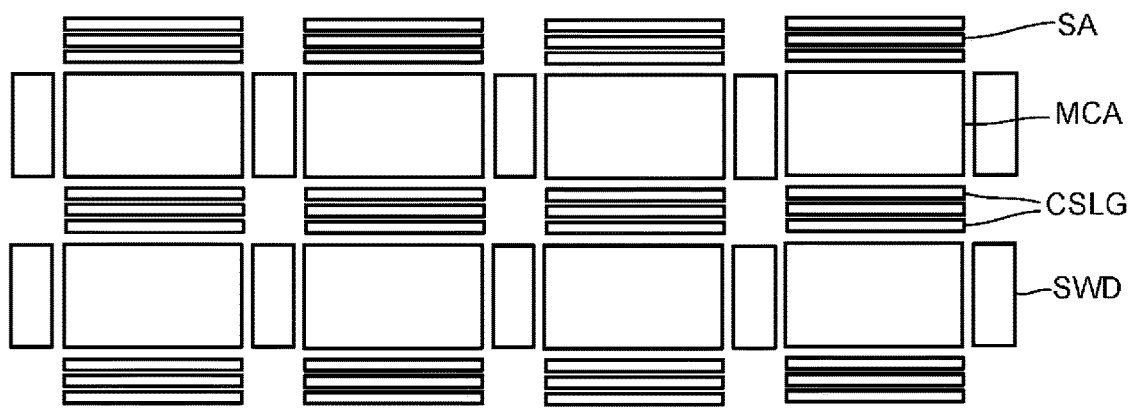
FIG. 4 depicts configurational aspects of a semiconductor storage device.
Figure 5:
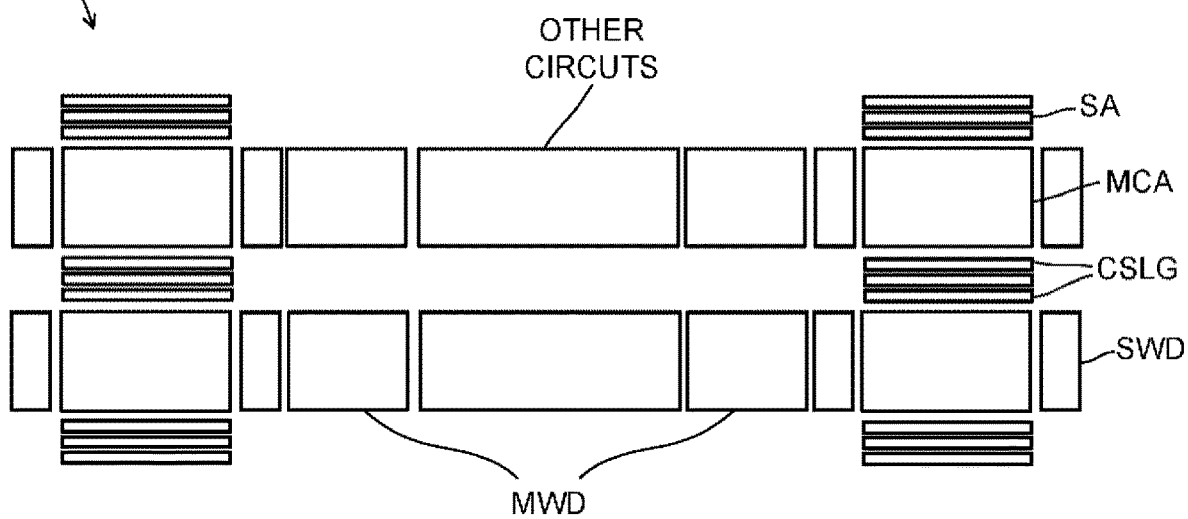
FIG. 5 depicts configurational aspects of a semiconductor storage device.

FIG. 4 is a block diagram illustrating a configuration example of a region 2 in FIG. 3. FIG. 5 is a block diagram illustrating a configuration example of a region 3 in FIG. 3. FIG. 4 illustrates arrangements of a memory cell MCA, a sense amplifier SA, a column selection circuit CSLG, and a segment word line driving circuit SWD. FIG. 5 also illustrates arrangements of a memory cell array MCA, a sense amplifier SA, a column selection circuit CSLG, a segment word line driving circuit SWD, along with a main word line driving circuit MWD.

Figure 6:
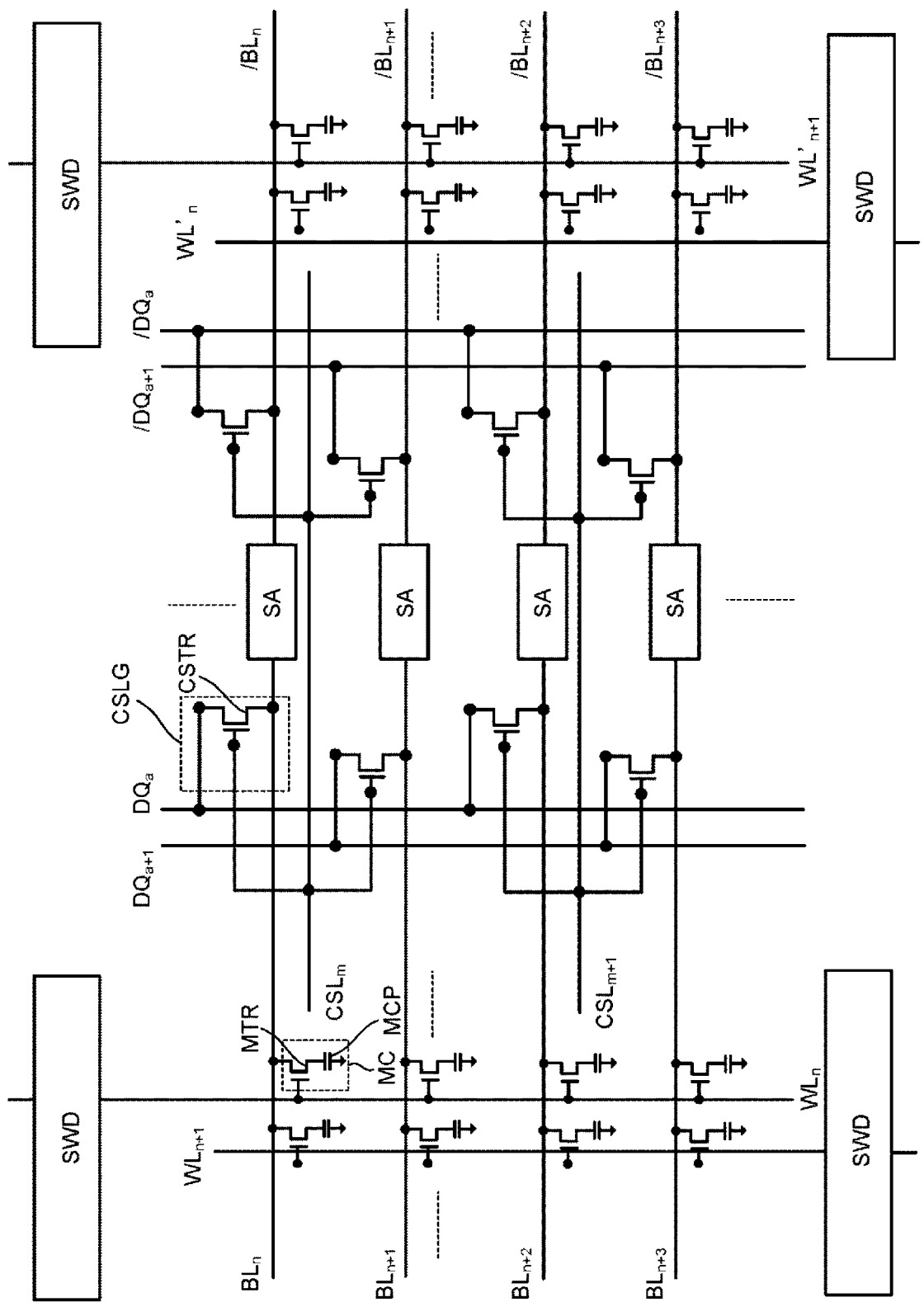
FIG. 6 is a schematic diagram of a circuit configuration of a semiconductor storage device.

FIG. 6 is a circuit diagram illustrating a circuit configuration example of the semiconductor storage device 1. FIG. 6 illustrates a plurality of sense amplifiers SA, a plurality of memory cells MC, a plurality of word lines WL (more particularly, word line $WL_n$, word line $WL_{n+1}$, word line $WL'_n$, word line $WL'_{n+1}$, where n is an integer), a plurality of bit lines BL (more particularly, bit line $BL_n$, bit line $BL_{n+1}$, bit line/$BL_n$, bit line/$BL_{n+1}$, where n is an integer), a plurality of column selection circuits CSLG, a plurality of column selection lines CSL (more particularly, column selection line $CSL_m$, column selection line $CSL_{m+1}$, where m is an integer), a plurality of data lines DQ (more particularly, data line $DQ_a$, data line $DQ_{a+1}$, data line/$DQ_a$, data line/$DQ_{a+1}$, where a is an integer), and a plurality of segment word line driving circuits SWD.

The plurality of memory cells MC are arranged in a matrix and constitute each memory cell array MCA. Each memory cell MC includes a memory transistor MTR, which is a field effect transistor (FET), and a memory capacitor MCP. A gate of the memory transistor MTR is connected to the corresponding word line WL, and one of a source and a drain of the memory transistor MTR is connected to the corresponding bit line BL. One electrode of the memory capacitor MCP is connected to the other of the source and the drain of the memory transistor MTR, and the other electrode of the memory capacitor MCP is connected to another wiring (not separately illustrated). The memory cell MC can store data by accumulating charges in the memory capacitor MCP according to the switching of the memory transistor MTR.

The sense amplifier SA is provided in the peripheral circuit PE1. The sense amplifier SA is connected to the corresponding bit line BL. The sense amplifier SA includes a circuit including a P-channel field effect transistor (Pch-FET or P-FET) and an N-channel field effect transistor (Nch-FET or N-FET).

The column selection circuit CSLG is provided in the peripheral circuit PE2. The column selection circuit CSLG selects a column of the memory cell array MCA. The column selection circuit CSLG includes a column select transistor CSTR which is a field effect transistor. A gate of the column select transistor CSTR is connected to the corresponding column selection line CSL, one of a source or a drain of the column select transistor CSTR is connected to the corresponding data line DQ, and the other of the source or the drain of the column select transistor CSTR is connected to the corresponding bit line BL. A potential of the column selection line CSL and the data line DQ is controlled by another circuit (not separately illustrated). FIG. 6 illustrates an example in which the gates of two column select transistors CSTR are connected to one column selection line CSL. The column selection circuit CSLG can select a bit line BL by switching the column select transistor CSTR.

A plurality of segment word line driving circuits SWD are provided for each memory cell array MCA. The segment word line driving circuits SWD are connected to the plurality of word lines WL, and select a row of the memory cell array MCA. FIG. 6 illustrates an example in which one of the plurality of segment word line driving circuits SWD is connected to the word line $WL_n$, another one of the plurality of segment word line driving circuits SWD is connected to the word line $WL_{n+1}$, yet another one of the plurality of segment word line driving circuits SWD is connected to the word line $WL'_n$, and still another one of the plurality of segment word line driving circuits SWD is connected to the word line $WL'_{n+1}$.

One main word line driving circuit MWD is provided for two or more segment word line driving circuits SWD. The main word line driving circuit MWD is connected to, for example, one of the plurality of segment word line driving circuits SWD and another one of the plurality of segment word line driving circuits SWD. The plurality of segment word line driving circuits SWD are connected to other circuits through the main word line driving circuit MWD. The semiconductor storage device 1 selects the segment word line driving circuit SWD via the main word line driving circuit MWD, and selects the row of the memory cell array MCA by selecting the word line WL via a selected segment word line driving circuit SWD.

Figures 7, 8:
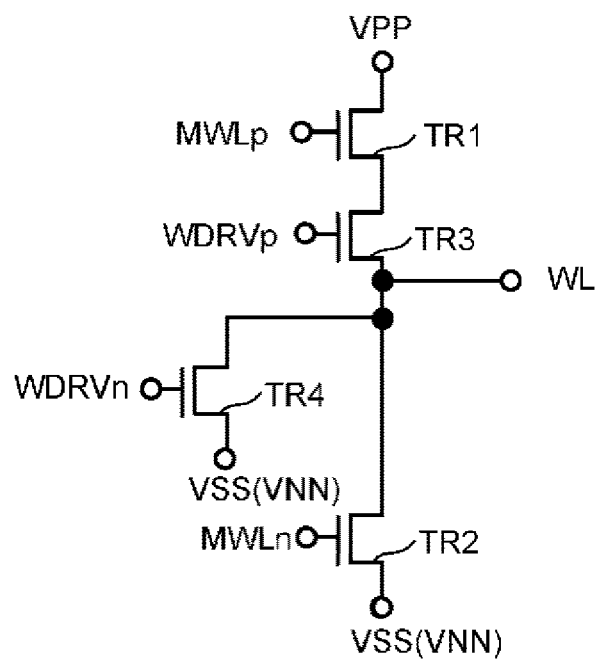
FIG. 7 is a schematic diagram illustrating an operation example of a segment word line driving circuit.
FIG. 8 is a truth table related to an operation example of a segment word line driving circuit.

FIG. 7 is a schematic diagram illustrating an operation example of a segment word line driving circuit SWD. FIG. 7 illustrates field effect transistors TR1, TR2, TR3, TR4 that form the segment word line driving circuit SWD. The field effect transistor TR1 to the field effect transistor TR4 are, for example, N-channel field effect transistors. The possible configurations of the segment word line driving circuit SWD are not limited to the particular configuration illustrated in FIG. 7.

A control signal MWLp is input from the main word line driving circuit MWD to a gate of the field effect transistor TR1, a power supply potential VPP is supplied to one of a source and a drain of the field effect transistor TR1, and the other of the source and the drain of the field effect transistor TR1 is connected to one of a source and a drain of the field effect transistor TR3. A control signal MWLn is input from the main word line driving circuit MWD to a gate of the field effect transistor TR2, a power supply potential VSS or a power supply potential VNN is supplied to one of a source and a drain of the field effect transistor TR2, and the other of the source and the drain of the field effect transistor TR2 is connected to the other of the source and the drain of the field effect transistor TR3. A control signal WDRVp is input to a gate of the field effect transistor TR3. A control signal WDRVn is input to a gate of the field effect transistor TR4, the power supply potential VSS or the power supply potential VNN is supplied to one of a source and a drain of the field effect transistor TR4, and the other of the source and the drain of the field effect transistor TR4 is connected to the other of the source and the drain of the field effect transistor TR3. The word line WL is connected to a connection point (node) between the field effect transistor TR2, the field effect transistor TR3, and the field effect transistor TR4. The power supply potential VPP is higher than the power supply potential VSS, and the power supply potential VNN is lower than the power supply potential VSS.

FIG. 8 is a truth table corresponding to an operation example of the segment word line driving circuit SWD. When the control signal MWLp and the control signal WDRVp are at a high level H and the control signal MWLn and the control signal WDRVn are at a low level L, the field effect transistors TR1 and TR3 are in an on state, the field effect transistors TR2 and TR4 are in an off state, and the word line WL is at the high level H and is in a selected state since the power supply potential VPP is supplied. When the control signal MWLp or the control signal WDRVp is at the low level L and the control signal MWLn or the control signal WDRVn is at the high level H, the field effect transistor TR1 or the field effect transistor TR3 is in the off state, the field effect transistor TR2 or the field effect transistor TR4 is in the on state, and the word line WL is at the low level L and is in a non-selected state since the power supply potential VSS or the power supply potential VNN is supplied. When one of the control signal MWLp or the control signal MWLn is at the low level L, the other of the control signal MWLp or the control signal MWLn is at the high level H. When one of the control signal WDRVp or the control signal WDRVn is at the low level L, the other of the control signal WDRVp or the control signal WDRVn is at the high level H. With the above operation, each word line WL can be selected.

Figure 9:
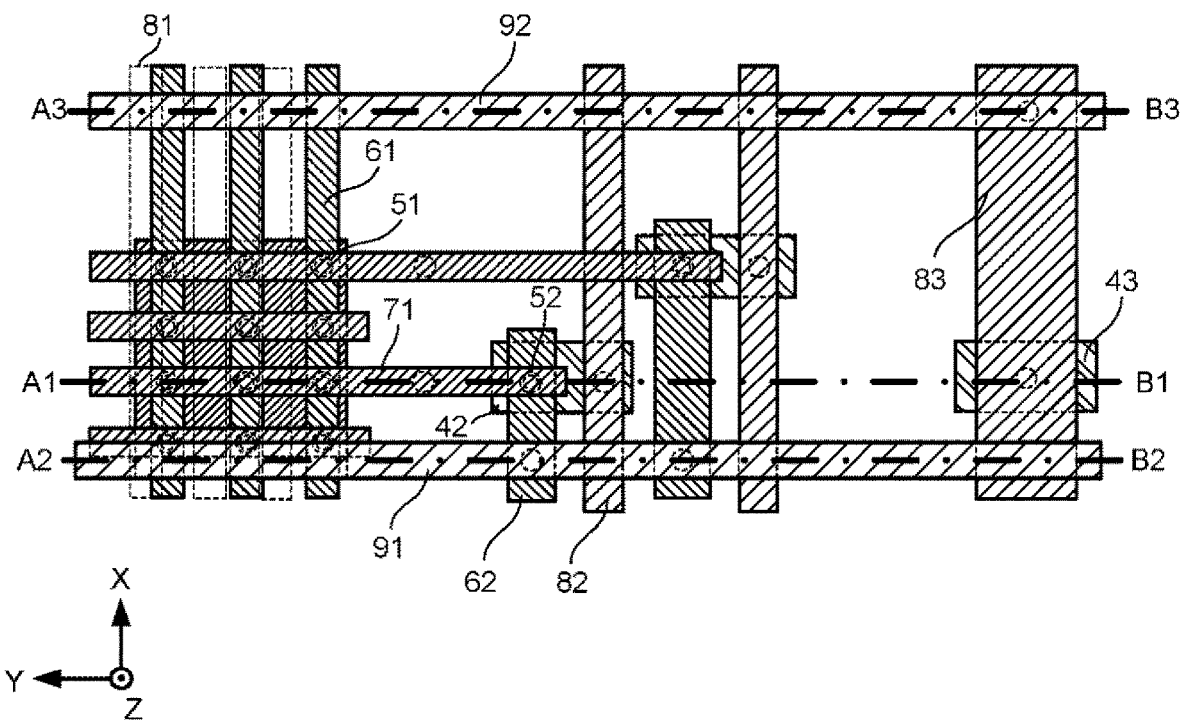
FIG. 9 is a schematic top view illustrating a structure of a semiconductor storage device.
Figure 10:
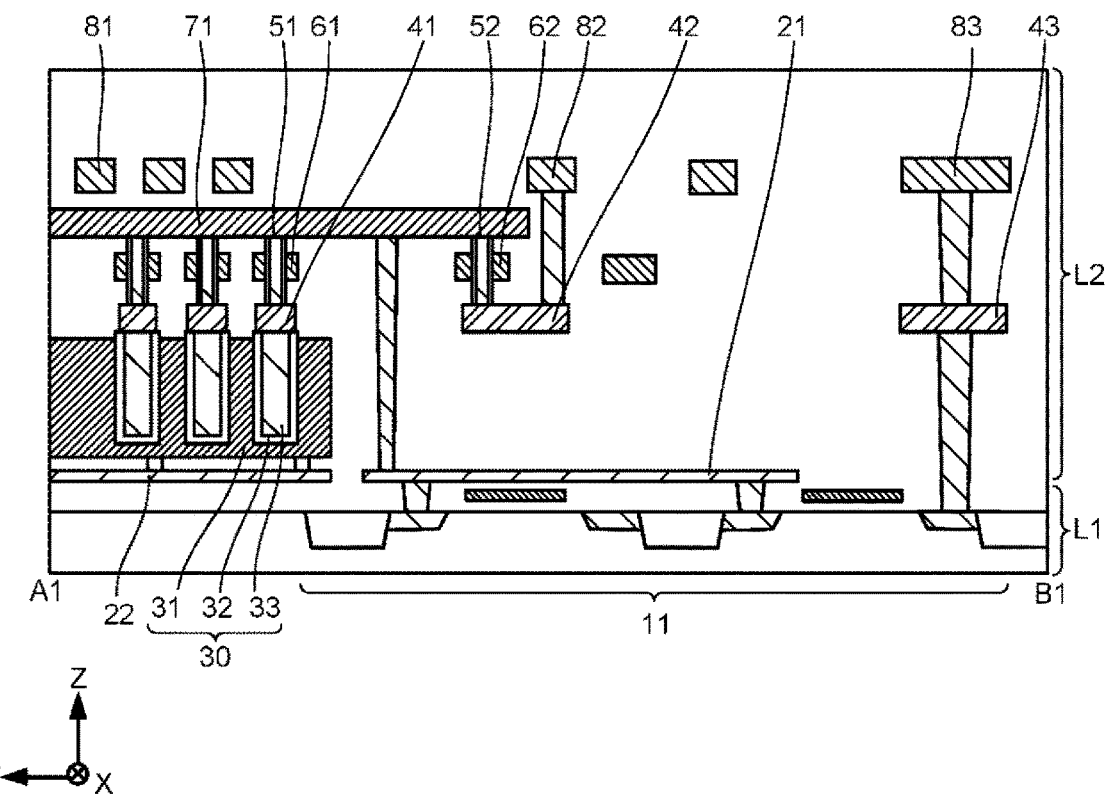
FIG. 10 is a schematic cross-sectional view illustrating a structure of a semiconductor storage device.
Figure 11:
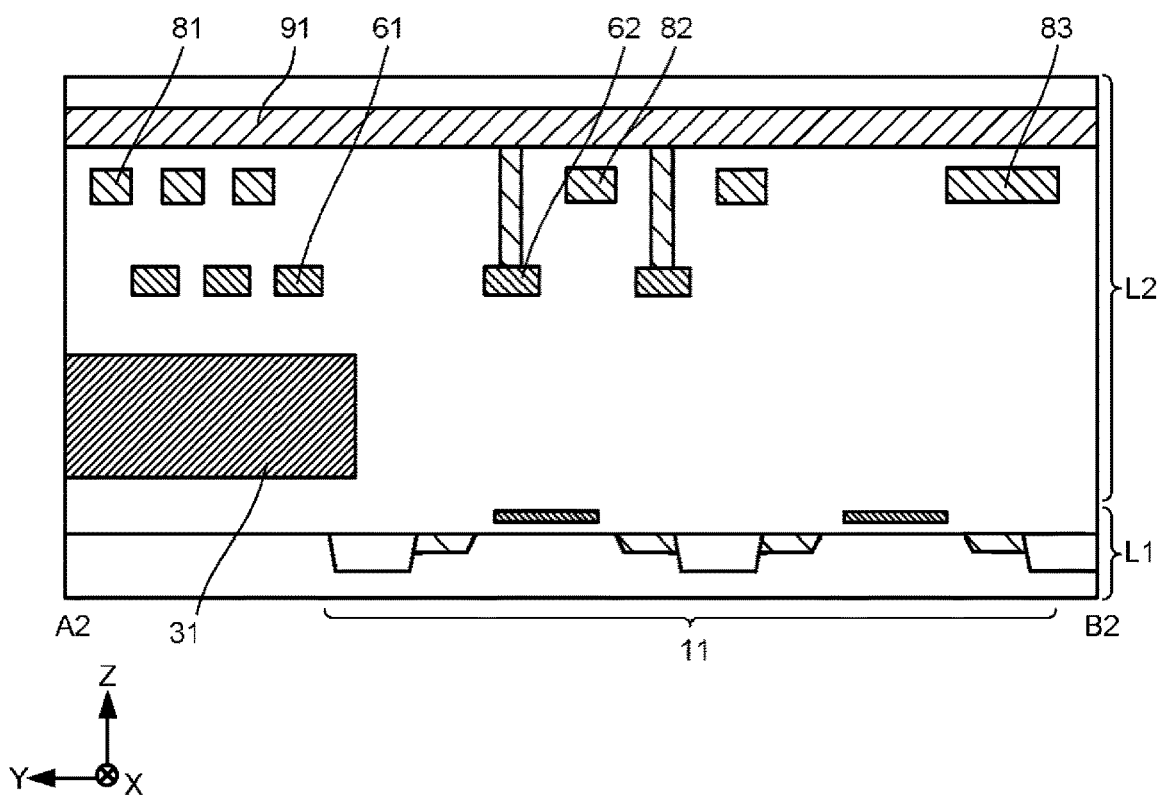
FIG. 11 is a schematic cross-sectional view illustrating a structure of a semiconductor storage device.
Figure 12:
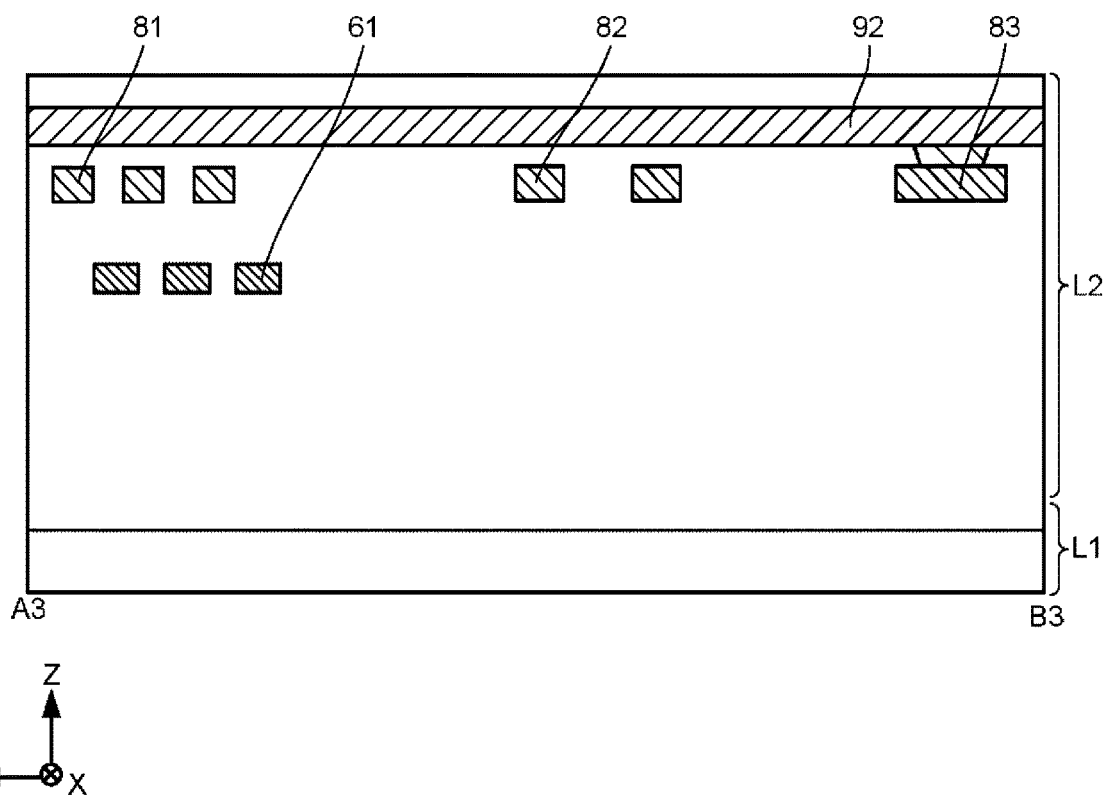
FIG. 12 is a schematic cross-sectional view illustrating a structure of a semiconductor storage device.

FIG. 9 is a schematic top view illustrating a structure example of the semiconductor storage device 1. FIG. 9 illustrates a part of the semiconductor storage device 1 on an X-Y plane. FIGS. 10 to 12 are schematic cross-sectional views illustrating the structure example of the semiconductor storage device 1. FIGS. 10 to 12 each illustrate a Y-Z cross section of the semiconductor storage device 1. FIG. 10 is a schematic diagram of the Y-Z cross section taken along a line segment A1-B1 in FIG. 9. FIG. 11 is a schematic diagram of the Y-Z cross section taken along a line segment A2-B2 in FIG. 9. FIG. 12 is a schematic diagram of the Y-Z cross section taken along a line segment A3-B3 in FIG. 9.

FIGS. 9 to 12 illustrate an example in which the peripheral circuit PE1 includes the sense amplifier SA and the peripheral circuit PE2 includes the column selection circuit CSLG. Note, in these depictions certain components are omitted for the sake of explanatory convenience.

The semiconductor storage device 1 illustrated in FIGS. 9 to 12 includes a circuit 11, a wiring 21, a wiring 22, and a capacitor 30, an oxide conductive layer 41, an oxide conductive layer 42, an oxide conductive layer 43, a field effect transistor 51, a field effect transistor 52, a wiring 61, a wiring 62, a wiring 71, a wiring 81, a wiring 82, a wiring 83, a wiring 91, and a wiring 92. Insulators are provided between components as necessary. Each component is formed using, for example, a photolithography technique.

The circuit 11 is provided in the stacked portion L1 and constitutes the sense amplifier SA. The circuit 11 can be formed using, for example, a semiconductor substrate such as a single crystal silicon substrate, and the Pch-FET and the Nch-FET each have a channel region, a source region, and a drain region in the semiconductor substrate.

The wiring 21 is provided in the stacked portion L2, is connected to one of the source region and the drain region of the Pch-FET of the circuit 11 through a via, and is connected to one of the source region and the drain region of the Nch-FET through a via.

The wiring 22 is provided in the stacked portion L2 and functions as a wiring that supplies a potential to the other electrode of the memory capacitor MCP, for example. The wiring 22 can be formed in the same step as the wiring 21 by processing, for example, one conductive layer.

The capacitor 30 is provided in the stacked portion L2, and constitutes the memory capacitor MCP illustrated in FIG. 6. The capacitor 30 is a three-dimensional capacitor, such as a so-called pillar-type capacitor or a cylinder-type capacitor. The capacitor 30 includes a plate electrode 31, an insulating film 32, and a cell electrode 33. The plate electrode 31 functions as an electrode of the memory capacitor MCP and is connected to the wiring 22. FIGS. 9 and 10 illustrate an example in which a plurality of capacitors 30 share one plate electrode 31. The insulating film 32 functions as a dielectric layer of the memory capacitor MCP and is provided between the plate electrode 31 and the cell electrode 33. The cell electrode 33 functions as one electrode of the memory capacitor MCP. A planar area (occupied die area) of the memory cell can be reduced by the use of a three-dimensional capacitor.

As illustrated in FIG. 10, the oxide conductive layer 41 is provided in contact with the cell electrode 33 in the stacked portion L2. The oxide conductive layer 41 contains, for example, a metal oxide such as indium-tin-oxide (ITO).

The oxide conductive layer 42 is provided in the stacked portion L2 and contains the same oxide semiconductor as the oxide of the oxide conductive layer 41. The oxide conductive layer 42 can be formed in the same step as the oxide conductive layer 41 by processing, for example, one oxide layer.

The oxide conductive layer 43 is provided in the stacked portion L2, and is connected to the source region or the drain region of the circuit 11 of the stacked portion L1 through a via, as illustrated in FIG. 10. The oxide conductive layer 43 contains the same oxide as the oxide of the oxide conductive layer 41. The oxide conductive layer 43 can be formed in the same step as the oxide conductive layer 41 and the oxide conductive layer 42 by processing, for example, one oxide layer.

As illustrated in FIG. 10, the field effect transistor 51 is provided above the capacitor 30 in the stacked portion L2, and constitutes the memory transistor MTR illustrated in FIG. 6. The field effect transistor 51 has a channel layer containing an oxide semiconductor such as a metal oxide. The channel layer of the field effect transistor 51 is in contact with the oxide conductive layer 41. The oxide conductive layer 41 is provided between the cell electrode 33 and the channel layer of the field effect transistor 51, and functions as the other of the source electrode or the drain electrode of the field effect transistor 51. Since the channel layer of the field effect transistor 51 contains a metal oxide similar to that of the oxide conductive layer 41, connection resistance between the field effect transistor 51 and the oxide conductive layer 41 can be reduced.

As illustrated in FIG. 10, the field effect transistor 52 is provided above the circuit 11 in the stacked portion L2, and constitutes the column select transistor CSTR illustrated in FIG. 6. The field effect transistor 52 has a channel layer containing an oxide semiconductor such as a metal oxide. The channel layer of the field effect transistor 52 is in contact with the oxide conductive layer 42. The oxide conductive layer 42 functions as one of the source electrode and the drain electrode of the field effect transistor 52. Since the channel layer of the field effect transistor 52 contains a metal oxide similar to that of the oxide conductive layer 42, the connection resistance between the field effect transistor 52 and the oxide conductive layer 42 can be reduced.

Figure 13:
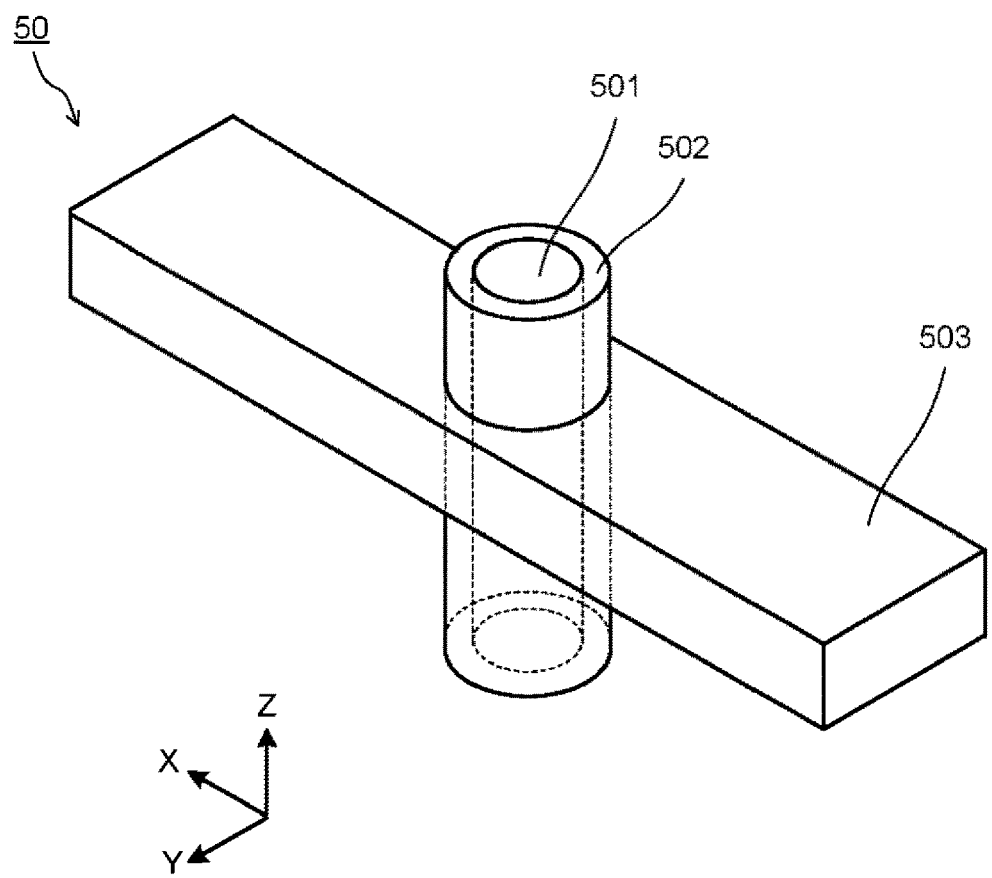
FIG. 13 is a schematic diagram illustrating aspects of a vertical transistor.

Each of the field effect transistor 51 and the field effect transistor 52 is a vertical transistor. FIG. 13 is a schematic diagram illustrating a structure example of a vertical transistor. A vertical transistor 50 illustrated in FIG. 13 has a channel layer 501 containing an oxide semiconductor, a gate insulating film 502 surrounding the channel layer 501, and a gate electrode 503 facing the channel layer 501 and sandwiching the gate insulating film 502. One end of the channel layer 501 in the Z-axis direction functions as one of the source and the drain, and the other functions as the other one of the source and the drain. The vertical transistor 50 illustrated in FIG. 13 is a so-called surrounding gate transistor (SGT) in which the gate electrode 503 surrounds the channel layer 501. With a vertical transistor, the planar area of the semiconductor storage device 1 can be reduced.

The channel layer 501 contains, for example, indium (In). The channel layer 501 contains, for example, indium oxide and gallium oxide, indium oxide and zinc oxide, or indium oxide and tin oxide. Examples thereof include an oxide containing indium, gallium, and zinc (an indium-gallium-zinc-oxide), such as so-called IGZO (InGaZnO).

The gate insulating film 502 contains, for example, an oxide or an oxynitride (for example, silicon oxide).

The gate electrode 503 extends in the X-axis direction or the Y-axis direction. FIG. 13 illustrates the gate electrode 503 extending in the X-axis direction. The gate electrode 503 contains, for example, a metal, a metal compound, or a semiconductor. In this example, the gate electrode 503 includes at least one material selected from the group consist of tungsten (W), titanium (Ti), titanium nitride (TiN), molybdenum (Mo), cobalt (Co), and ruthenium (Ru), for example.

A field effect transistor having a channel layer containing an oxide semiconductor has an off-leakage current lower than that of a field effect transistor provided on the semiconductor substrate. Therefore, for example, since the data stored in the memory cell MC can be stored for a long time, the number of times for a refresh operation can be reduced. Furthermore, since the field effect transistor having a channel layer containing an oxide semiconductor can be formed by a low temperature process, it is possible to prevent thermal stress from being applied to the capacitor 30 and the peripheral circuit PE1 during fabrication.

As illustrated in FIG. 10, the wiring 61 extends in the stacked portion L2 in the X-axis direction, and constitutes a word line WL. The wiring 61 also functions as a gate electrode of the field effect transistor 51 (similarly to the gate electrode 503 of the vertical transistor 50 illustrated in FIG. 13). FIGS. 9 to 12 illustrate a plurality of wirings 61.

A wiring 62 extends in the stacked portion L2 in the X-axis direction and constitutes the column selection line CSL. The wiring 62 also functions as a gate electrode of the field effect transistor 52 (similarly to the gate electrode 503 of the vertical transistor 50 illustrated in FIG. 13). The wiring 62 can be formed in the same step as the wiring 61 by processing, for example, one conductive layer.

The wiring 71 is provided above the wiring 61 in the stacked portion L2, intersects with the wiring 61, extends in the Y-axis direction, and constitutes a bit line BL. The wiring 71 extends above the wiring 21 in the stacked portion L2 and is connected to the wiring 21 through a via.

The wiring 71 is provided in contact with the channel layer of the field effect transistor 51 (similarly to the channel layer 501 of the vertical transistor 50 illustrated in FIG. 13) above the field effect transistor 51, and functions as one of the source electrode and the drain electrode of the field effect transistor 51. The wiring 71 is provided in contact with the channel layer of the field effect transistor (similarly to the channel layer 501 of the vertical transistor 50 illustrated in FIG. 13) above the field effect transistor 52, and functions as one of the source electrode and the drain electrode of the field effect transistor 52. FIG. 9 illustrates a plurality of wirings 71.

A wiring 81 is provided above the wiring 71 in the stacked portion L2 and extends in the X-axis direction. The wiring constitutes a global word line selection wiring that connects the segment word line driving circuit SWD and the main word line driving circuit MWD. In FIG. 9, the wiring 81 is illustrated by dotted lines for depictional convenience.

The wiring 82 extends in the stacked portion L2 in the X-axis direction and constitutes the data line DQ illustrated in FIG. 6. As illustrated in FIGS. 9 and 10, the wiring 82 is connected to the oxide conductive layer 42 through a via. The wiring 82 can be formed in the same step as the wiring 81 by processing, for example, one conductive layer.

The wiring 82 is connected to the other of the source and the drain of the field effect transistor 52 through the oxide conductive layer 42. Accordingly, a connection path between the field effect transistor 52 and the data line DQ can be shortened as compared to the case where the field effect transistor 52 is provided in the semiconductor substrate. This permits the connection resistance to be reduced.

A wiring 83 extends in the stacked portion L2 in the X-axis direction and is connected to the oxide conductive layer 43 through a via. The wiring 83 can be formed in the same step as the wiring 81 and the wiring 82 by processing, for example, one conductive layer.

A wiring 91 extends in the stacked portion L2 in the Y-axis direction and constitutes the column selection line CSL. The wiring 91 is provided above the wiring 81 and above the wiring 82. As illustrated in FIGS. 9 and 11, the wiring 91 is connected to the wiring 62 through a via.

A wiring 92 extends in the stacked portion L2 in the Y-axis direction. The wiring 92 is provided above the wiring 83. As illustrated in FIGS. 9 and 12, the wiring 92 is connected to the wiring 83 through a via. Although not specifically illustrated, the wiring 92 is connected to a power supply line or the like for supplying the power supply potential VSS.

As described above, the semiconductor storage device according to the present embodiment can increase a degree of freedom in the layout of a peripheral circuit by providing the stacked portion L2 including the peripheral circuit PE2 including the column selection circuit CSLG above the stacked portion L1 including the peripheral circuit PE1 including the sense amplifier SA, and reducing the peripheral circuit provided in the stacked portion L1.

In a semiconductor storage device in the related art, the column selection circuit CSLG is provided in the stacked portion L1 the same as the sense amplifier SA. In this case, it is necessary to increase the area of the semiconductor storage device in order to allocate a region for forming the column selection circuit CSLG. In addition, the connection path between the column selection circuit CSLG and the data line DQ will be longer, a via with a high aspect ratio is required, and the connection resistance will be increased. In contrast, in the semiconductor storage device according to the present embodiment, by providing the column selection circuit CSLG above the sense amplifier SA, the area of the semiconductor storage device can be reduced, and the connection path between the column selection circuit CSLG and the data line DQ can be shortened to reduce the connection resistance.

Second Embodiment

Figure 14:
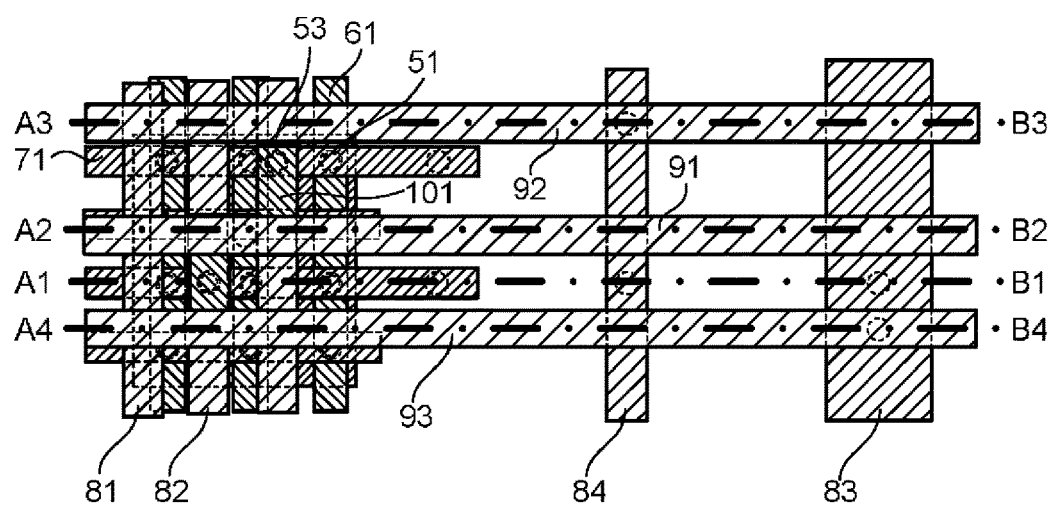
FIG. 14 is a schematic top view illustrating aspects of a semiconductor storage device according to a second embodiment.
Figure 15:
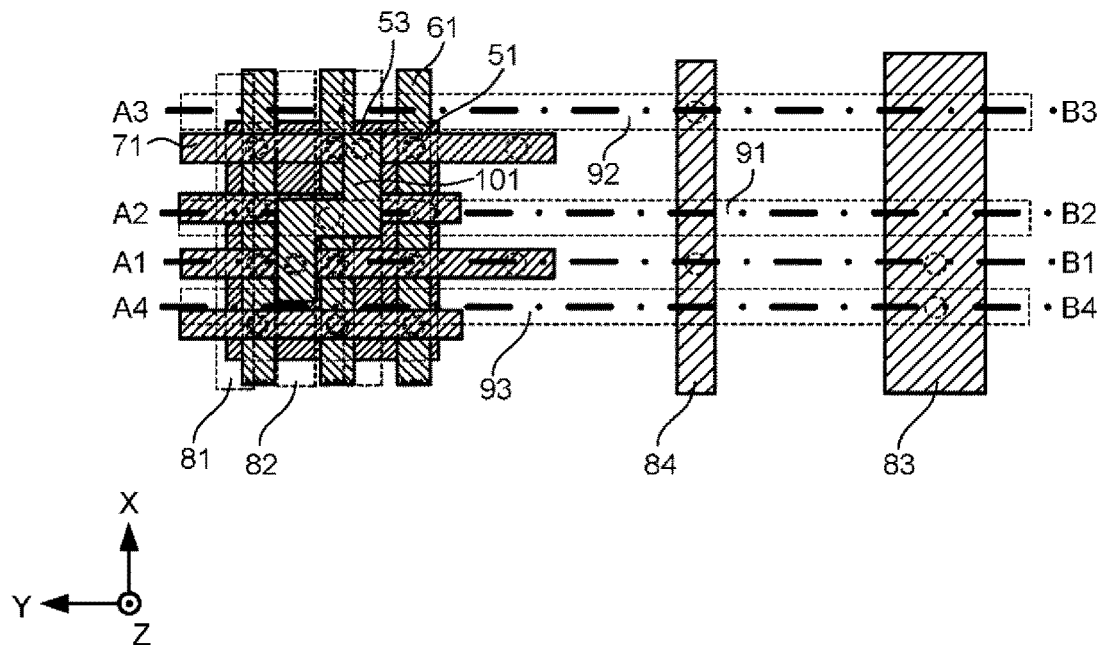
FIG. 15 is a schematic top view illustrating aspects of a semiconductor storage device according to a second embodiment.
Figure 16:
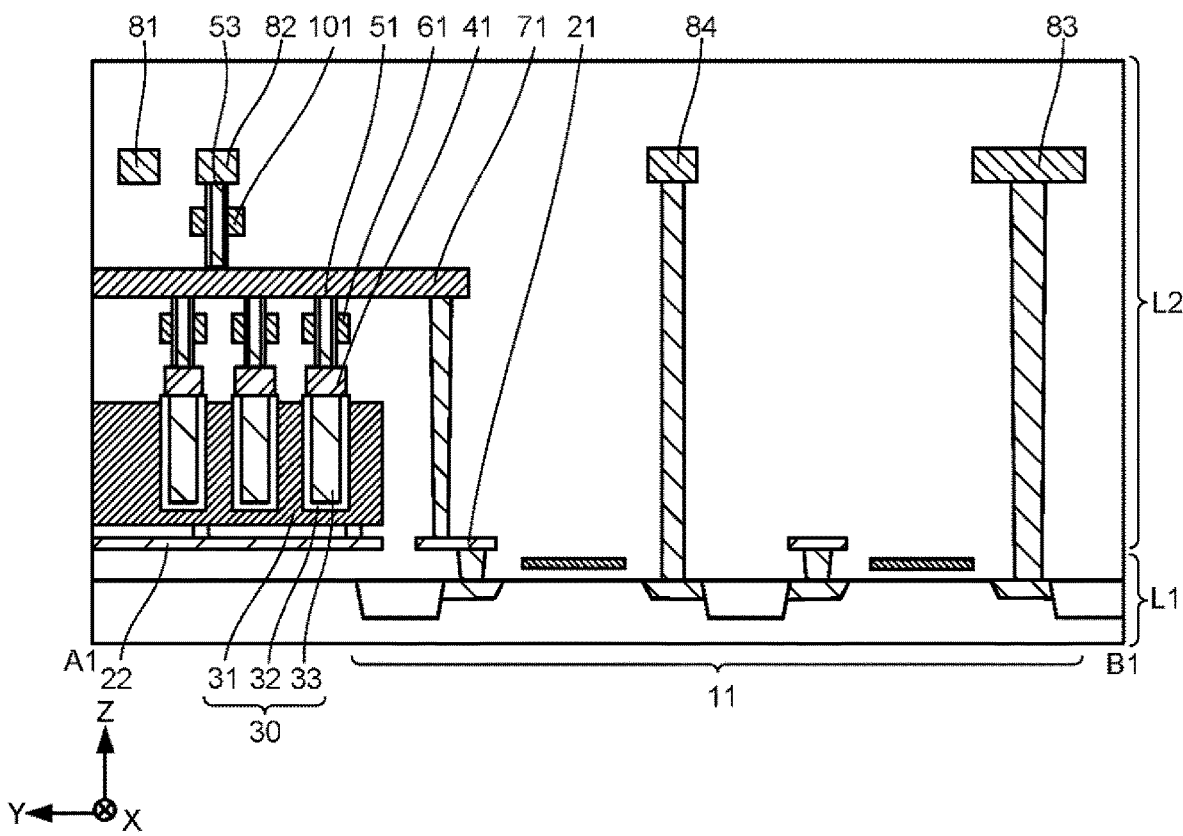
FIGS. 16-19 are schematic cross-sectional views illustrating aspects of a semiconductor storage device according to a second embodiment.
Figure 17:
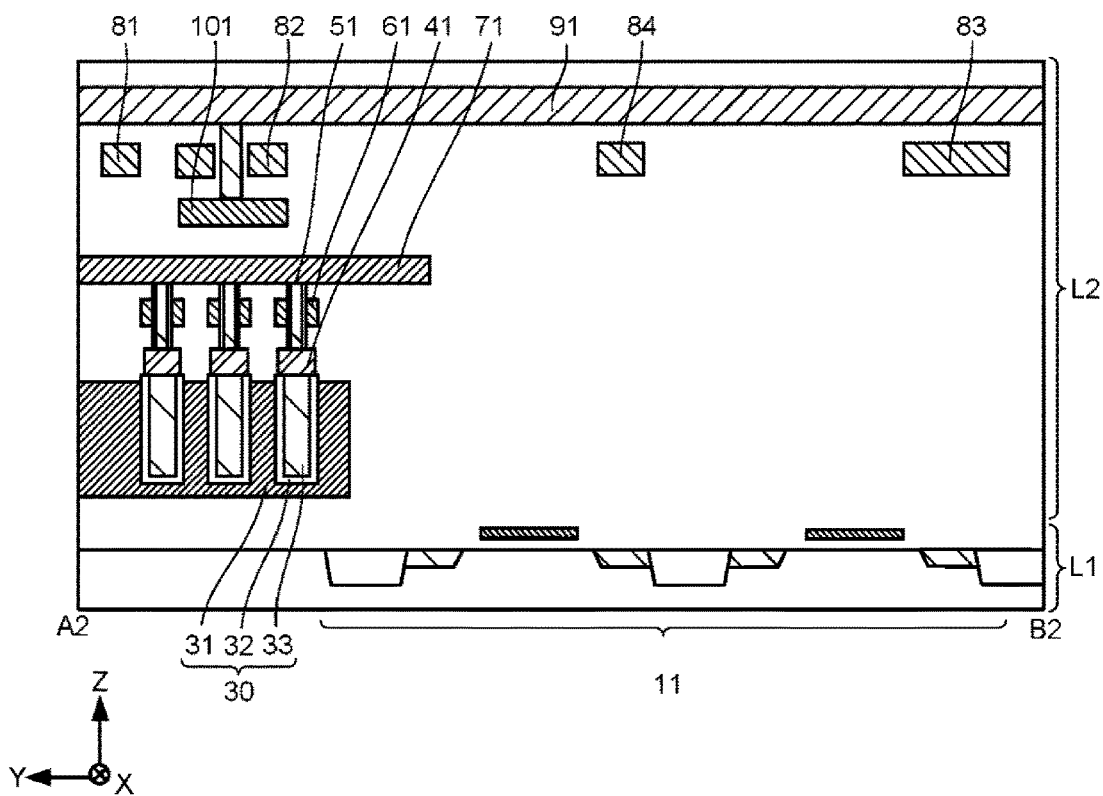
Figure 18:
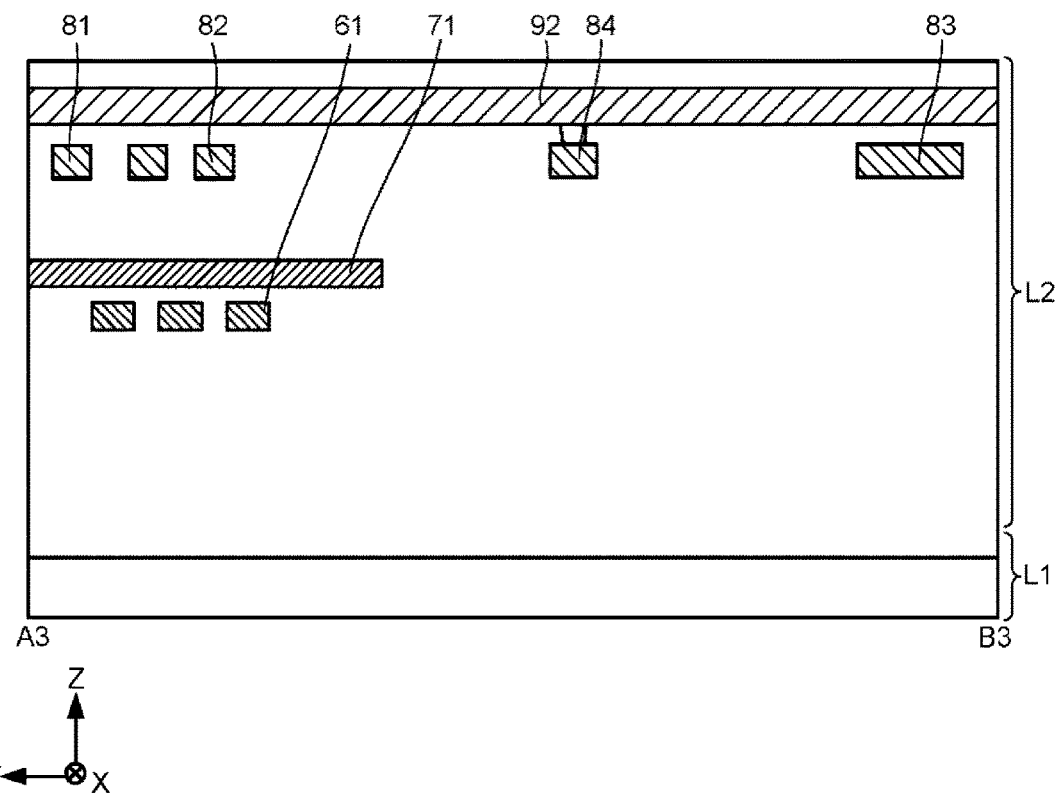
Figure 19:
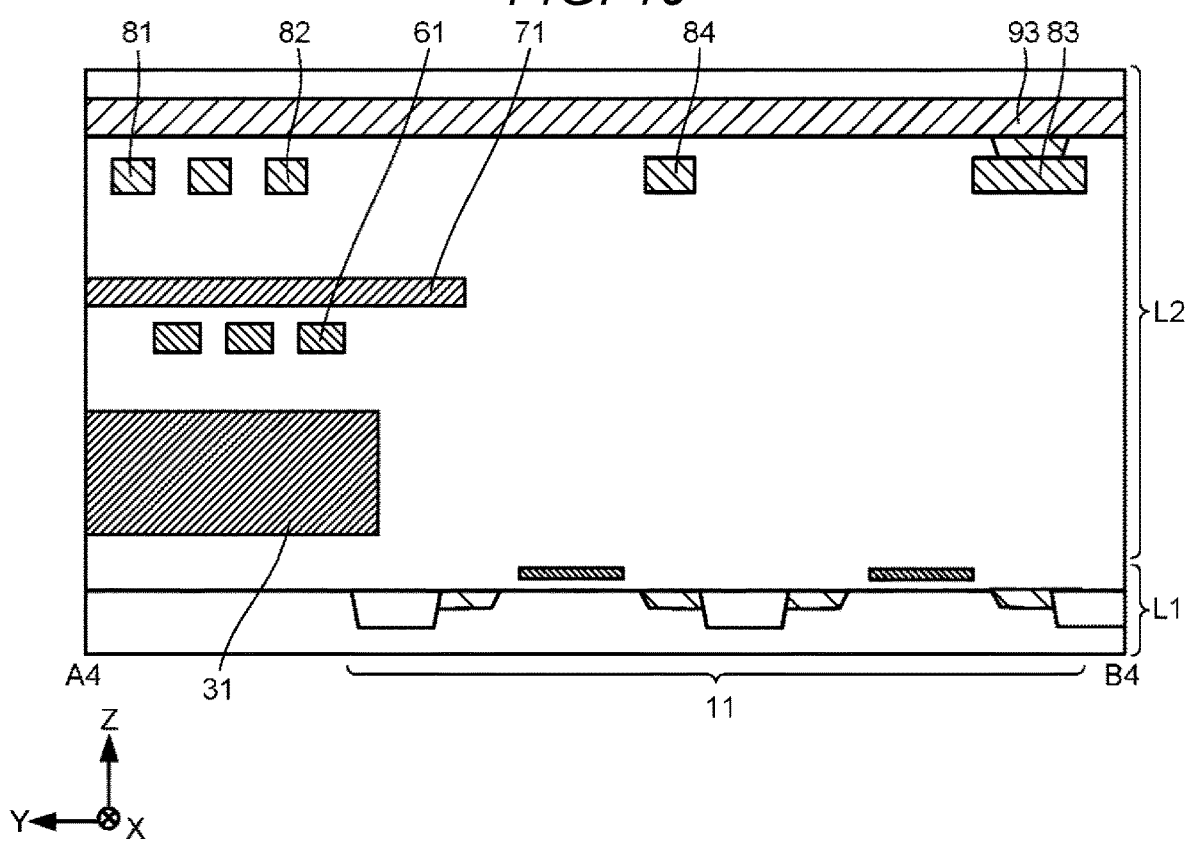

FIGS. 14 and 15 are schematic top views illustrating another structure example of a semiconductor storage device 1. FIGS. 14 and 15 illustrate a part of the semiconductor storage device 1 on the X-Y plane. FIG. 15 illustrates a part of the components in FIG. 14 with dotted lines. FIGS. 16 to 19 are schematic cross-sectional views the semiconductor storage device 1 according to the second embodiment. Each illustrates a Y-Z cross section of the semiconductor storage device 1 according to the second embodiment. FIG. 16 is a schematic diagram in the Y-Z cross section taken along a line segment A1-B1 of FIGS. 14 and 15. FIG. 17 is a schematic diagram of the Y-Z cross section taken along a line segment A2-B2 in FIGS. 14 and 15. FIG. 18 is a schematic diagram of the Y-Z cross section taken along the line segment A3-B3 in FIGS. 14 and 15. FIG. 19 is a schematic diagram of the Y-Z cross section taken along a line segment A4-B4 in FIGS. 14 and 15.

FIGS. 14 to 19 illustrate an example in which the peripheral circuit PE1 includes the sense amplifier SA and the column selection circuit CSLG is provided above the memory cell MC. Note, depiction of some of the components is omitted for the sake of explanatory convenience.

The semiconductor storage device 1 illustrated in FIGS. 14 to 19 includes the circuit 11, the wiring 21, the wiring 22, the capacitor 30, the oxide conductive layer 41, the field effect transistor 51, a field effect transistor 53, the wiring 61, the wiring 71, the wiring 81, the wiring 82, the wiring 83, a wiring 84, the wiring 91, the wiring 92, a wiring 93, and a wiring 101. Insulators are provided among components as necessary. Since the circuit 11, the wiring 21, the wiring 22, the capacitor 30, the oxide conductive layer 41, the field effect transistor 51, the wiring 61, and the wiring 81 are respectively the same as the circuit 11, the wiring 21, the wiring 22, the capacitor 30, the oxide conductive layer 41, the field effect transistor 51, the wiring 61, and the wiring 81 in the first embodiment, overlapping description thereof will be omitted.

In this embodiment, the wiring 71 is provided above the wiring 61 in the stacked portion L2. The wiring 71 intersects with the wiring 61, extends in the Y-axis direction, and constitutes the bit line BL. The wiring 71 extends above the wiring 21 in the stacked portion L2 and is connected to the wiring 21 through a via.

The wiring 71 is provided in contact with the channel layer of the field effect transistor 51 above the field effect transistor 51, and functions as one of the source electrode and the drain electrode of the field effect transistor 51. FIG. 14 illustrates a plurality of wirings 71.

As illustrated in FIG. 16, the field effect transistor 53 is provided above the wiring 71 in the stacked portion L2, and constitutes the column select transistor CSTR illustrated in FIG. 6. The field effect transistor 53 has a channel layer containing an oxide semiconductor. The channel layer of the field effect transistor 53 is in contact with the wiring 71. The description of the field effect transistor 52 in the first embodiment can be appropriately applied to other aspects of the field effect transistor 53.

As illustrated in FIG. 16, a wiring 101 is provided above the wiring 71 in the stacked portion L2. The wiring 101 also functions as a gate electrode of the field effect transistor 53. FIGS. 13 and 15 illustrate an example in which two column select transistors CSTR share one wiring 101.

A wiring 82 extends in the stacked portion L2 in the X-axis direction and constitutes the data line DQ illustrated in FIG. 6. As illustrated in FIG. 16, the wiring 82 is provided in contact with the channel layer of the field effect transistor 53 above the field effect transistor 53, and functions as one of the source electrode and the drain electrode of the field effect transistor 53. FIGS. 14 and 15 illustrate a plurality of wirings 82, and FIG. 15 illustrates the wiring 82 with dotted lines. The wiring 82 can be formed in the same step as the wiring 81 by processing, for example, one conductive layer.

A wiring 83 extends in the stacked portion L2 in the X-axis direction, and is connected to the circuit 11 through a via, as illustrated in FIG. 16. The wiring 83 can be formed in the same step as the wiring 81 by processing, for example, one conductive layer.

A wiring 84 extends in the stacked portion L2 in the X-axis direction, and is connected to the circuit 11 through a via, as illustrated in FIG. 16. The wiring 84 can be formed in the same step as the wiring 81 by processing, for example, one conductive layer.

A wiring 91 extends in the stacked portion L2 in the Y-axis direction and constitutes the column selection line CSL. The wiring 91 is provided above the wiring 101. FIG. 15 illustrates the wiring 91 with dotted lines. As illustrated in FIGS. 14, 15, and 17, the wiring 91 is connected to the wiring 101 through a via.

A wiring 92 extends in the stacked portion L2 in the Y-axis direction. The wiring 92 is provided above the wiring 81 or above the wiring 84. FIG. 15 illustrates the wiring 92 with dotted lines. As illustrated in FIGS. 14, 15, and 18, the wiring 92 is connected to the wiring 84 through a via. The wiring 92 constitutes a power supply line for supplying the power supply potential VDD. The power supply potential VDD is higher than the power supply potential VSS.

A wiring 93 extends in the stacked portion L2 in the Y-axis direction. The wiring 93 is provided above the wiring 81 or above the wiring 84. FIG. 15 illustrates the wiring 93 with dotted lines. As illustrated in FIGS. 14, 15, and 19, the wiring 93 is connected to the wiring 83 through a via. The wiring 93 constitutes a power supply line for supplying the power supply potential VSS.

As described above, the semiconductor storage device according to the second embodiment can increase a degree of freedom in the layout of the peripheral circuit by providing the stacked portion L2 including the column selection circuit CSLG above the stacked portion L1 including the peripheral circuit PE1 including the sense amplifier SA, and reducing the peripheral circuit provided in the stacked portion L1.

In the semiconductor storage device in the related art, the column selection circuit CSLG is provided in the stacked portion L1 the same as the sense amplifier SA. In such a case, it is necessary to increase the area of the semiconductor storage device in order to allocate a region for forming the column selection circuit CSLG. In addition, the connection path between the column selection circuit CSLG and the data line DQ is longer, a via with a high aspect ratio is required, and the connection resistance is increased. In contrast, in the semiconductor storage device according to the second embodiment, by providing the column selection circuit CSLG above the memory cell MC, the planar area of the semiconductor storage device can be further reduced, and the connection path between the column selection circuit CSLG and the data line DQ can be shortened to reduce the connection resistance.

Third Embodiment

Figure 20:
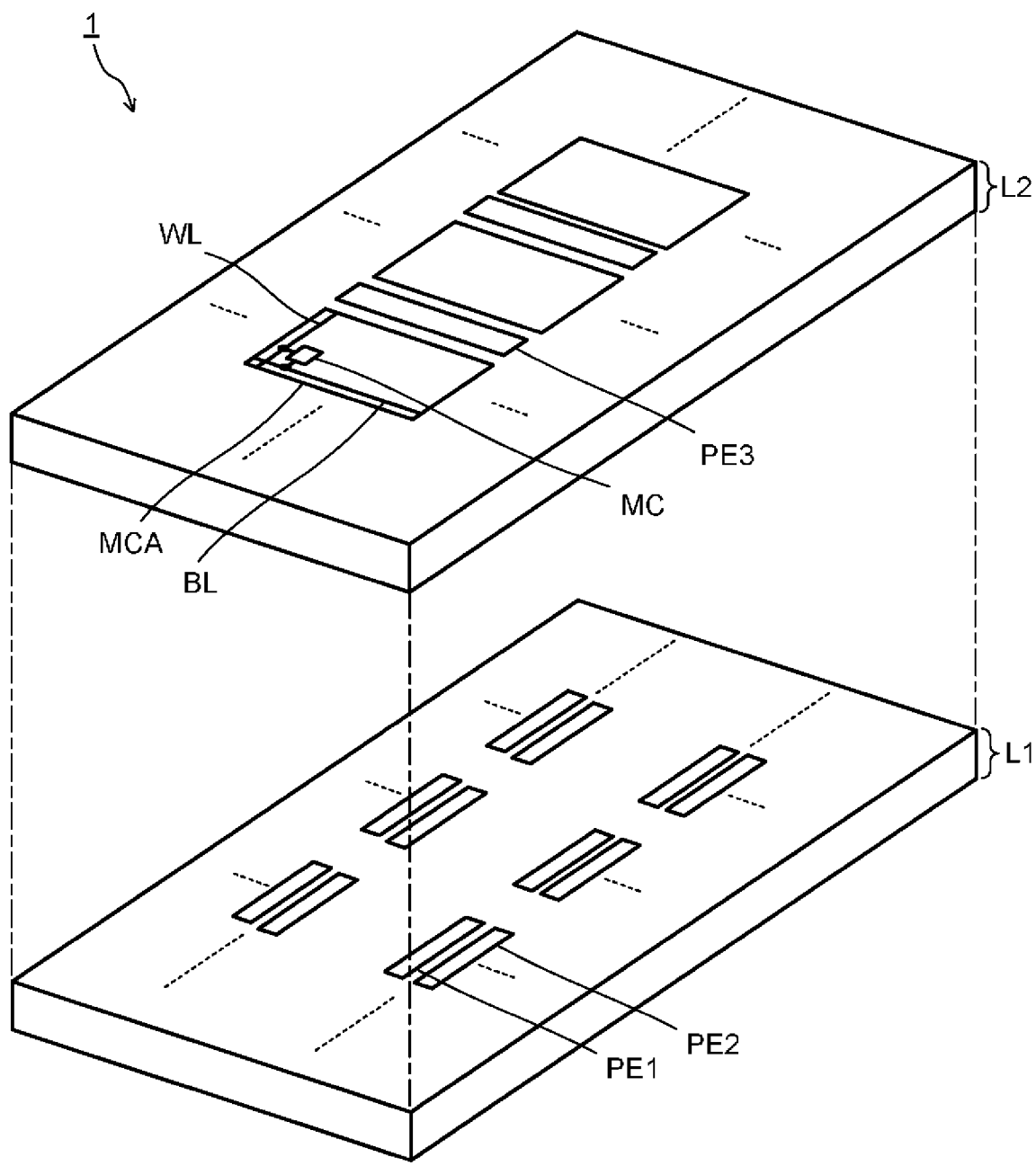
FIG. 20 is a schematic diagram illustrating aspects of a semiconductor storage device according to a third embodiment.
Figure 21:
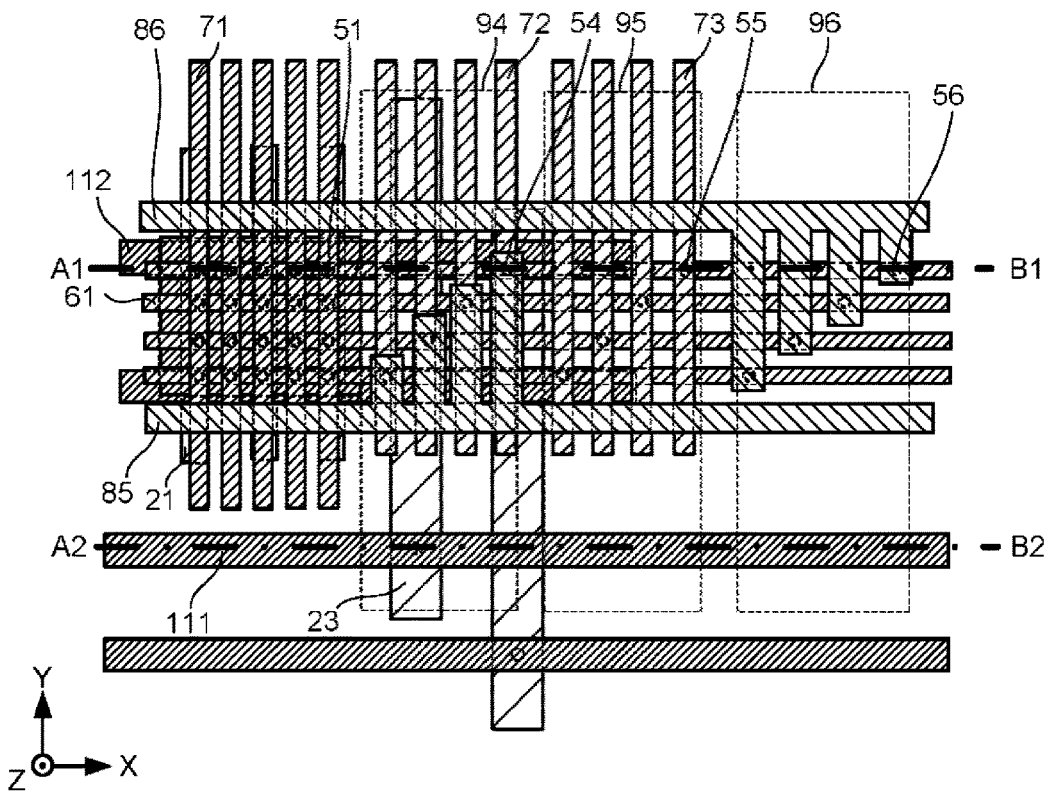
FIGS. 21-24 are schematic top views illustrating aspects of a semiconductor storage device according to a third embodiment.

FIG. 20 is a schematic diagram illustrating yet another configuration example of a semiconductor storage device. The semiconductor storage device 1 illustrated in FIG. 20 differs from the semiconductor storage device 1 illustrated in FIG. 1 in that at least the peripheral circuit PE3 is provided in the stacked portion L2. For aspects otherwise corresponding to the semiconductor storage device 1 illustrated in FIG. 1, the description provided in conjunction with the first embodiment can be appropriately applied.

Figure 22:
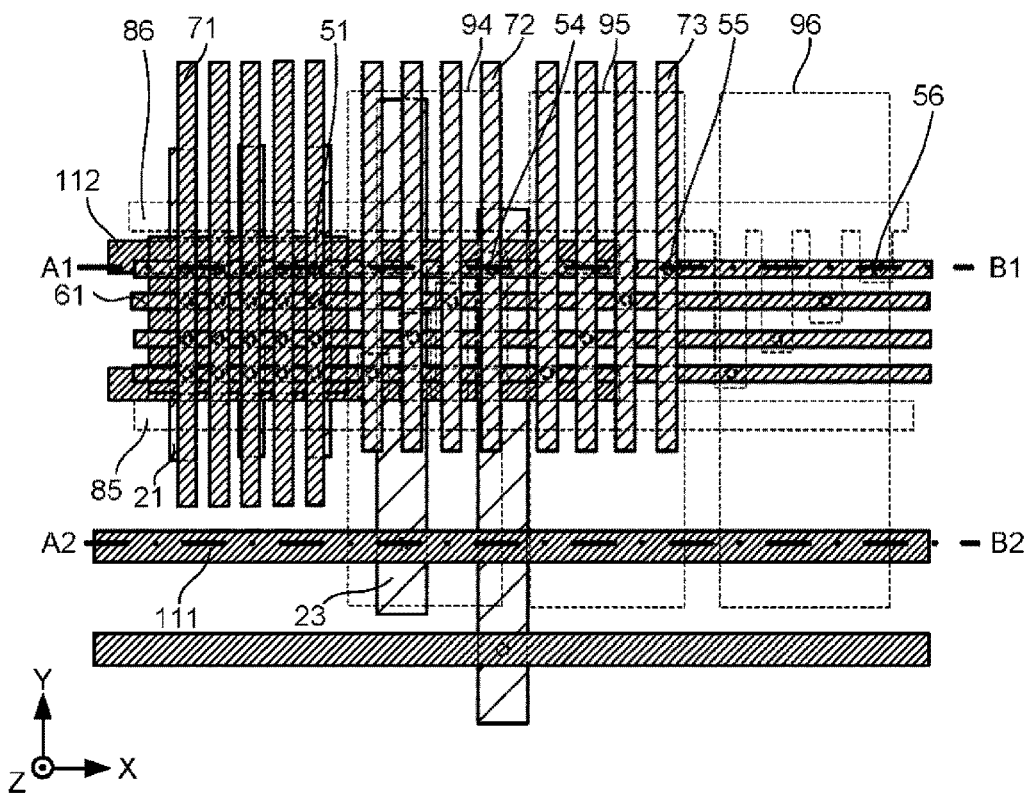
Figure 23:
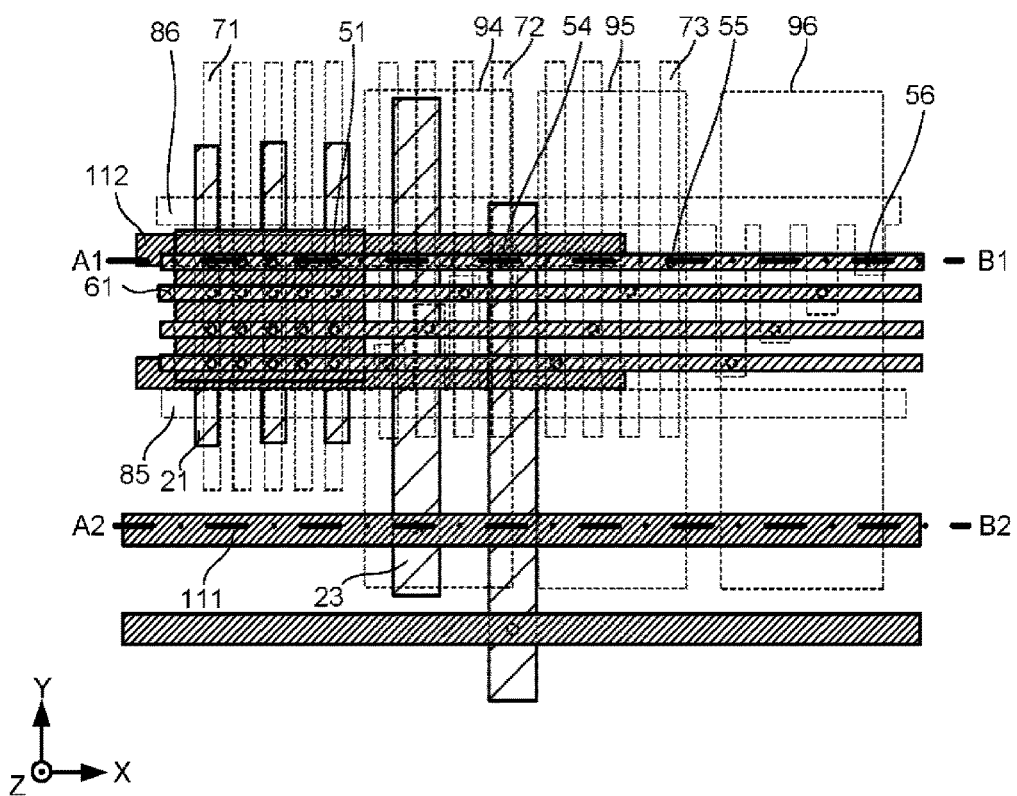
Figure 24:
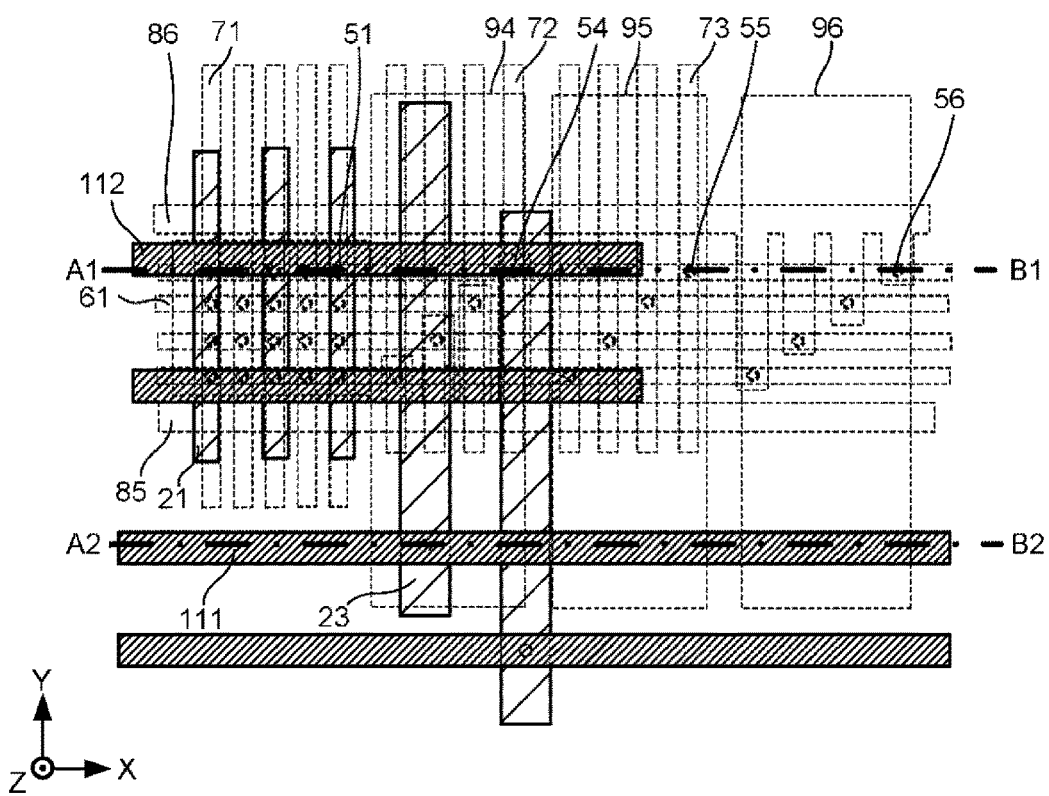
Figure 25:
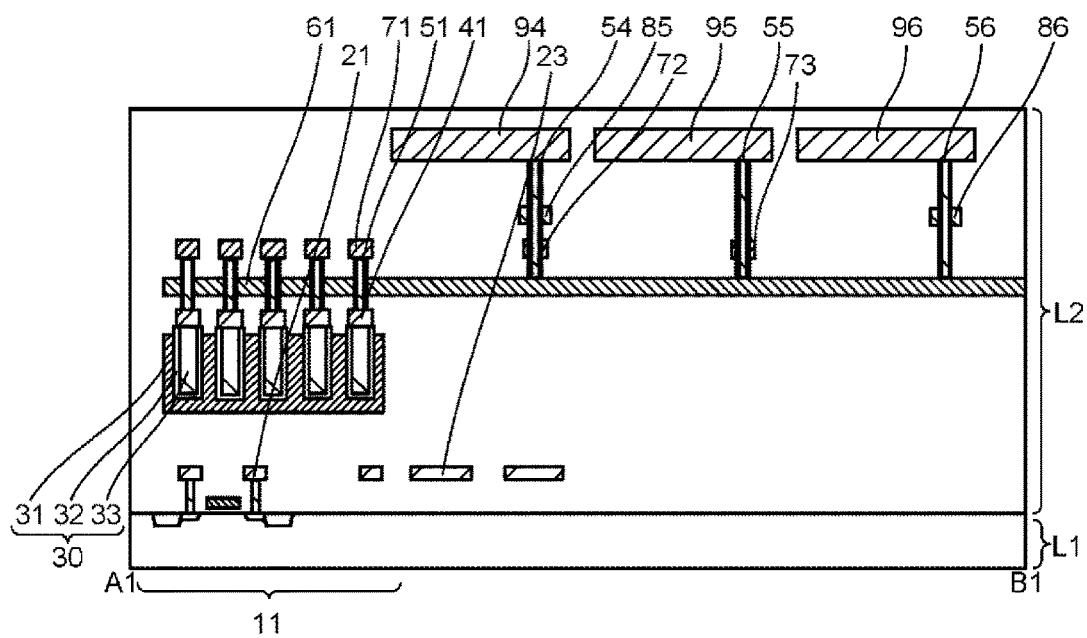
FIGS. 25 and 26 are schematic cross-sectional views illustrating aspects of a semiconductor storage device according to a third embodiment.
Figure 26:
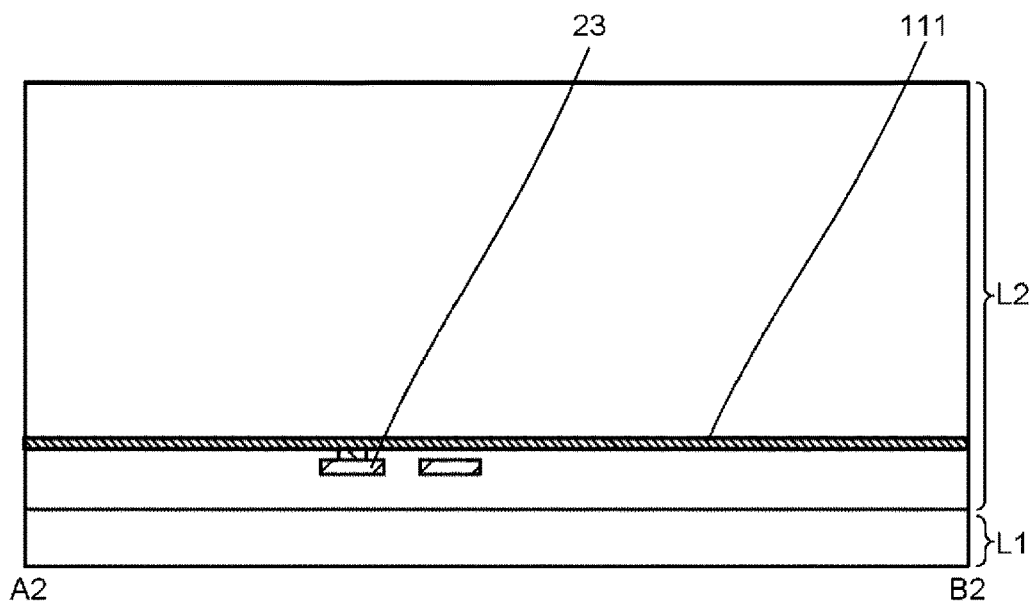

FIGS. 21 to 24 are schematic top views illustrating a semiconductor storage device 1 according to the third embodiment. FIGS. 21 to 24 each illustrate a part of the semiconductor storage device 1 on the X-Y plane. FIG. 22 illustrates a part of the components in FIG. 21 with dotted lines. FIG. 23 illustrates a part of the components in FIG. 22 with dotted lines. FIG. 24 illustrates a part of the components in FIG. 23 with dotted lines. FIGS. 25 and 26 are schematic cross-sectional views illustrating the semiconductor storage device 1 according to the third embodiment. FIGS. 25 and 26 each illustrate a Y-Z cross section of the semiconductor storage device 1. FIG. 25 is a schematic diagram of the Y-Z cross section taken along the line segment A1-B1 in FIGS. 21 to 24. FIG. 26 is a schematic diagram of the Y-Z cross section taken along the line segment A2-B2 in FIGS. 21 to 24.

FIGS. 21 to 26 illustrate an example in which the peripheral circuit PE1 includes the sense amplifier SA and the peripheral circuit PE3 includes the segment word line driving circuit SWD. Note that certain components are omitted from these figures for the sake of depictional convenience.

The semiconductor storage device 1 illustrated in FIGS. 21 to 26 includes the circuit 11, the wiring 21, a wiring 23, the capacitor 30, the oxide conductive layer 41, the field effect transistor 51, a field effect transistor 54, a field effect transistor 55, a field effect transistor 56, the wiring 61, the wiring 71, a wiring 72, a wiring 73, the wiring 81, the wiring 82, the wiring 83, a wiring 85, a wiring 86, a wiring 94, a wiring 95, a wiring 96, a wiring 111, and a wiring 112. Insulators are provided among components as necessary. Since the circuit 11, the wiring 21, the capacitor 30, the oxide conductive layer 41, the field effect transistor 51, the wiring 61, and the wiring 81 are respectively the same as the circuit 11, the wiring 21, the capacitor 30, the oxide conductive layer 41, the field effect transistor 51, the wiring 61, and the wiring 81 in the first embodiment, additional description thereof will be omitted.

A wiring 23 extends in the stacked portion L2 in the Y-axis direction. The wiring 23 functions as a signal line or a power supply line, for example. The wiring 23 can be formed in the same step as the wirings 21 and 22 in the first embodiment by processing, for example, one conductive layer.

As illustrated in FIG. 25, the field effect transistor 54 is provided above the wiring 61 in the stacked portion L2, and constitutes the field effect transistors TR1 and TR3 illustrated in FIG. 7 in the segment word line driving circuit SWD. The field effect transistor 54 has a channel layer containing an oxide semiconductor. The channel layer of the field effect transistor 54 is in contact with the wiring 61. The wiring 61 also functions as a source electrode or a drain electrode of the field effect transistor 54.

As illustrated in FIG. 25, the field effect transistor 55 is provided above the wiring 61 in the stacked portion L2, and constitutes the field effect transistor TR4 illustrated in FIG. 7 in the segment word line driving circuit SWD. The field effect transistor 55 has a channel layer containing an oxide semiconductor. The channel layer of the field effect transistor 55 is in contact with the wiring 61. The wiring 61 also functions as a source electrode or a drain electrode of the field effect transistor 55.

As illustrated in FIG. 25, the field effect transistor 56 is provided above the wiring 61 in the stacked portion L2, and constitutes the field effect transistor TR2 illustrated in FIG. 7 in the segment word line driving circuit SWD. The field effect transistor 56 has a channel layer containing an oxide semiconductor. The channel layer of the field effect transistor 56 is in contact with the wiring 61. The wiring 61 also functions as a source electrode or a drain electrode of the field effect transistor 56.

Each of the field effect transistor 54 to the field effect transistor 56 is a vertical transistor. The vertical transistor has, for example, the structure of the vertical transistor 50 illustrated in FIG. 13.

A wiring 72 is provided above the wiring 61 in the stacked portion L2, intersects with the wiring 61, and extends in the Y-axis direction. The control signal WDRVp illustrated in FIG. 7 is supplied to the wiring 72. The wiring 72 also functions as a gate electrode of the field effect transistor 54. FIGS. 21 to 24 illustrate a plurality of wirings 72.

A wiring 73 is provided above the wiring 61 in the stacked portion L2, intersects with the wiring 61, and extends in the Y-axis direction. The control signal WDRVn illustrated in FIG. 7 is supplied to the wiring 73. The wiring 73 also functions as a gate electrode of the field effect transistor 55. FIGS. 21 to 24 illustrate a plurality of wirings 73.

A wiring 85 is provided above the wiring 71 in the stacked portion L2. The control signal MWLp illustrated in FIG. 7 is supplied to the wiring 85. The wiring 85 also functions as a gate electrode of the field effect transistor 54.

A wiring 86 is provided above the wiring 61 in the stacked portion L2. The wiring 86 is connected to the wiring 81 in the first embodiment or the second embodiment, for example. The control signal MWLn illustrated in FIG. 7 is supplied to the wiring 86. The wiring 86 also functions as a gate electrode of the field effect transistor 56.

A wiring 94 extends in the stacked portion L2 in the Y-axis direction. The wiring 94 is provided above the wiring 85. The wiring 94 is provided in contact with the channel layer of the field effect transistor 54 above the field effect transistor 54, and functions as the source electrode or the drain electrode of the field effect transistor 54. The power supply potential VPP illustrated in FIG. 7 is supplied to the wiring 94.

A wiring 95 extends in the stacked portion L2 in the Y-axis direction. The wiring 95 is provided above the wiring 73. The wiring 95 is provided in contact with the channel layer of the field effect transistor 55 above the field effect transistor 55, and functions as the source electrode or the drain electrode of the field effect transistor 55. The power supply potential VSS or the power supply potential VNN illustrated in FIG. 7 is supplied to the wiring 95.

A wiring 96 extends in the stacked portion L2 in the Y-axis direction. The wiring 96 is provided above the wiring 86. The wiring 96 is provided in contact with the channel layer of the field effect transistor 56 above the field effect transistor 56, and functions as the source electrode or the drain electrode of the field effect transistor 56. The power supply potential VSS or the power supply potential VNN illustrated in FIG. 7 is supplied to the wiring 96.

The wiring 111 extends in the stacked portion L2 in the X-axis direction, and is connected to the wiring 23 through a via as illustrated in FIG. 26. FIGS. 21 to 24 illustrate a plurality of wirings 111. The wiring 111 has a function as a signal line or a power supply line, for example.

The wiring 112 extends in the stacked portion L2 in the X-axis direction, and is connected to the wiring 23 through a via as illustrated in FIG. 24. FIGS. 21 to 24 illustrate a plurality of wirings 112. The wiring 112 has a function as a signal line or a power supply line, for example.

As described above, the semiconductor storage device according to the third embodiment can increase a degree of freedom in the layout of the peripheral circuit by providing the stacked portion L2 including the peripheral circuit PE3 including the segment word line driving circuit SWD above the stacked portion L1 including the peripheral circuit PE1 including the sense amplifier SA, and reducing the peripheral circuit provided in the stacked portion L1.

In the semiconductor storage device in the related art, the segment word line driving circuit SWD is provided in the stacked portion L1 the same as the sense amplifier SA. In such a case, it is necessary to increase the planar area of the semiconductor storage device in order to allocate a region for forming the segment word line driving circuit SWD. In addition, the connection path between the segment word line driving circuit SWD and the signal line is long, a via with a high aspect ratio is required, and the connection resistance is increased. In contrast, in the semiconductor storage device according to the third embodiment, by providing the peripheral circuit PE1 below the memory cell MC and the sense amplifier SA below the memory cell MC, the area of the semiconductor storage device can be reduced, and the connection path between the segment word line driving circuit SWD and the signal line can be shortened to reduce the connection resistance.

The third embodiment can be combined with other example embodiments as appropriate. For example, as in the first embodiment or the second embodiment, the column selection circuit CSLG may be further provided in the stacked portion L2.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
a first stacked portion including a first peripheral circuit; and
a second stacked portion above the first stacked portion and including a memory cell, a word line connected to the memory cell, a bit line connected to the memory cell and the first peripheral circuit, and at least one of a second peripheral circuit connected to the bit line or a third peripheral circuit connected to the word line, wherein
the at least one of the second peripheral circuit or the third peripheral circuit includes a field effect transistor having a channel layer containing an oxide semiconductor,
the first peripheral circuit comprises a sense amplifier,
the third peripheral circuit comprises a word line driving circuit connected to the word line, and
the word line driving circuit is above the word line.

2. The semiconductor storage device according to claim 1, wherein
the second peripheral circuit comprises a column selection circuit connected to the bit line, and
the column selection circuit is above the sense amplifier.

3. The semiconductor storage device according to claim 1, wherein
the second peripheral circuit comprises a column selection circuit connected to the bit line, and
the column selection circuit is above the memory cell.

4. The semiconductor storage device according to claim 1, wherein the sense amplifier is below the memory cell.

5. The semiconductor storage device according to claim 4, wherein
the second stacked portion includes:
a plurality of the memory cells,
a plurality of word lines,
a plurality of bit lines,
a plurality of word line driving circuits, and
a second word line driving circuit,
a first one of the plurality of word line driving circuits is connected to one of the plurality of word lines,
a second one of the plurality of word line driving circuits is connected to another one of the plurality of word lines, and
the second word line driving circuit is connected to the first one of the plurality of word line driving circuits and the second one of the plurality of word line driving circuits.

6. The semiconductor storage device according to claim 1, wherein
the second stacked portion includes:
a plurality of the memory cells,
a plurality of word lines,
a plurality of bit lines,
a plurality of word line driving circuits, and
a second word line driving circuit,
a first one of the plurality of word line driving circuits is connected to one of the plurality of word lines,
a second one of the plurality of word line driving circuits is connected to another one of the plurality of word lines, and
the second word line driving circuit is connected to the first one of the plurality of word line driving circuits and the second one of the plurality of word line driving circuits.

7. The semiconductor storage device according to claim 1, wherein the memory cell includes:
   a capacitor including a first electrode and a second electrode, and a field effect transistor above the capacitor and including a channel layer containing an oxide semiconductor.

8. The semiconductor storage device according to claim 7, wherein the memory cell further includes an oxide conductive layer between the second electrode and the channel layer.

9. The semiconductor storage device according to claim 8, wherein the oxide conductive layer is an indium-tin-oxide.

10. The semiconductor storage device according to claim 1, wherein the oxide semiconductor is an indium-gallium-zinc-oxide.

11. The semiconductor storage device according to claim 1, wherein the memory cell is a dynamic random access memory cell.

12. The semiconductor storage device according to claim 1, wherein the field effect transistor is a vertical transistor.

* * * * *